United States Patent [19]

Floyd

[11] Patent Number: 4,549,094
[45] Date of Patent: Oct. 22, 1985

[54] DEBOUNCE CIRCUIT PROVIDING SYNCHRONOUSLY CLOCKED DIGITAL SIGNALS

[75] Inventor: William M. Floyd, Livonia, Mich.

[73] Assignee: United Technologies Automotive, Inc., Dearborn, Mich.

[21] Appl. No.: 540,586

[22] Filed: Oct. 7, 1983

[51] Int. Cl.⁴ .................... H03K 17/56; H03K 5/01
[52] U.S. Cl. ............................ 307/247 A; 328/164;
340/365 E; 307/268; 307/471; 307/480;
307/464
[58] Field of Search ............... 328/164; 340/365 E;
307/247 A, 268, 475, 471, 480, 464

[56] References Cited

U.S. PATENT DOCUMENTS

| | | | |
|---|---|---|---|
| 4,005,316 | 1/1977 | Tomlinson | 307/247 A |
| 4,028,560 | 6/1977 | Bainter | 307/247 A |
| 4,031,410 | 6/1977 | Kikuchi | 307/209 |

Primary Examiner—Stanley D. Miller
Assistant Examiner—Richard Roseen
Attorney, Agent, or Firm—Stephen A. Schneeberger

[57] ABSTRACT

An improved debouncer circuit is disclosed for providing debounced, synchronously clocked digital signals from a single-throw switch, as for instance, of the momentary contact type. A signal, variable between two logic levels, is provided by the switch for input to the debouncer circuitry. That input signal is applied as one input to an EXCLUSIVE OR gate, the other input to that gate being fed back from the Q output terminal of an output data latch having complementary Q and Q* output terminals. A signal representing the Q* output terminal of the data latch is connected to the D input of that latch such that a synchronous latch clocking signal appearing at the clock input of the output data latch serves to toggle the states of the Q and Q* output terminals. The signal appearing at either one of the output terminals Q, Q* of the output data latch may be used as the debounced signal provided to other circuitry, depending upon signal polarity needs. The clocking signal which toggles the output data latch is the output of a NAND gate. The inputs to the NAND gate include one phase of a two-phase synchronous clock signal, the output of the EXCLUSIVE OR gate, and the signal from the Q output of a second data latch. The second data latch is clocked by the other phase of the two-phase synchronous clock. The D input of the second data latch is connected to the output of an AND gate, with the inputs to the AND gate being provided by the Q* output of the second data latch and by the output of the EXCLUSIVE OR gate.

3 Claims, 14 Drawing Figures

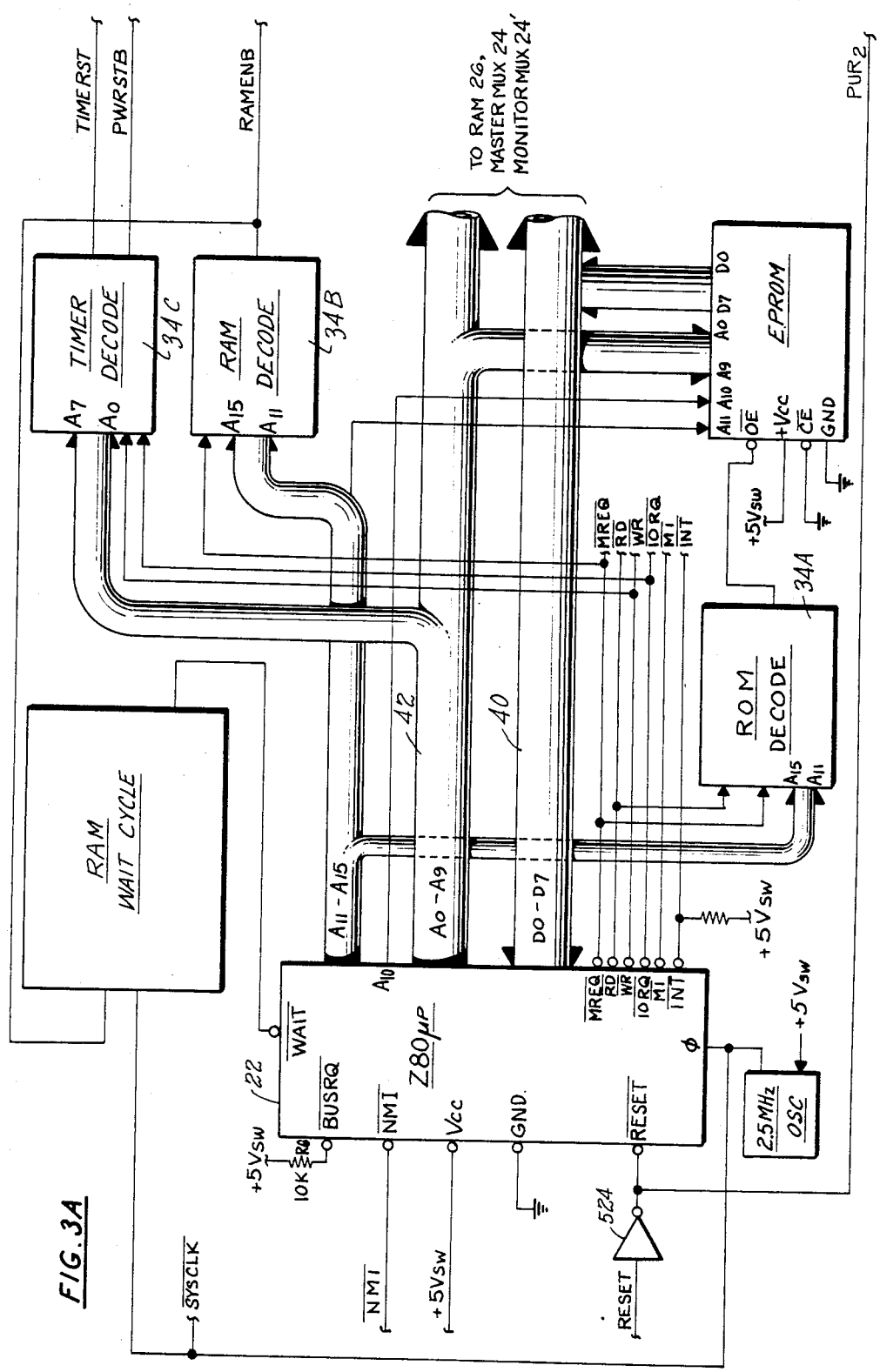

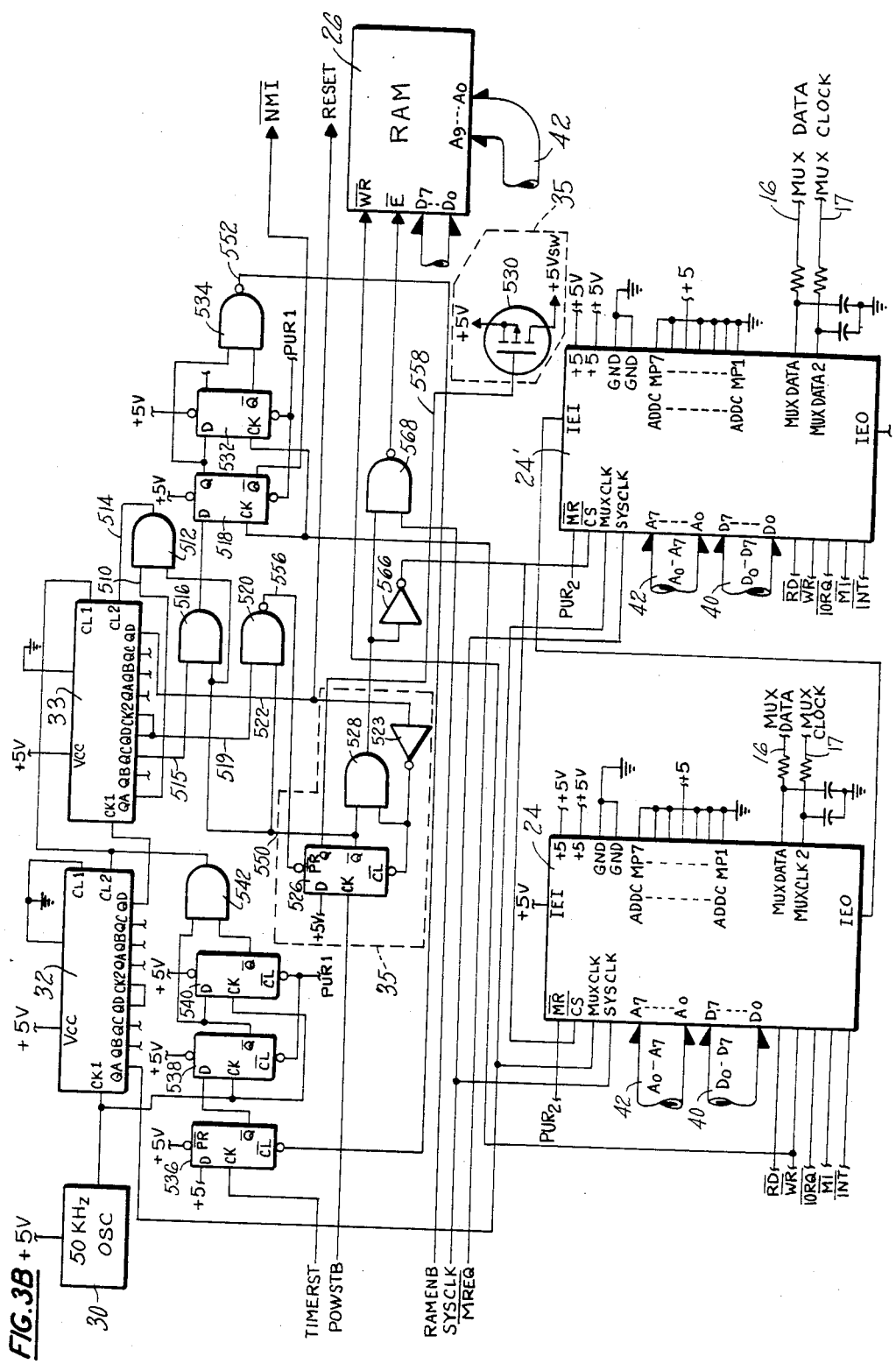

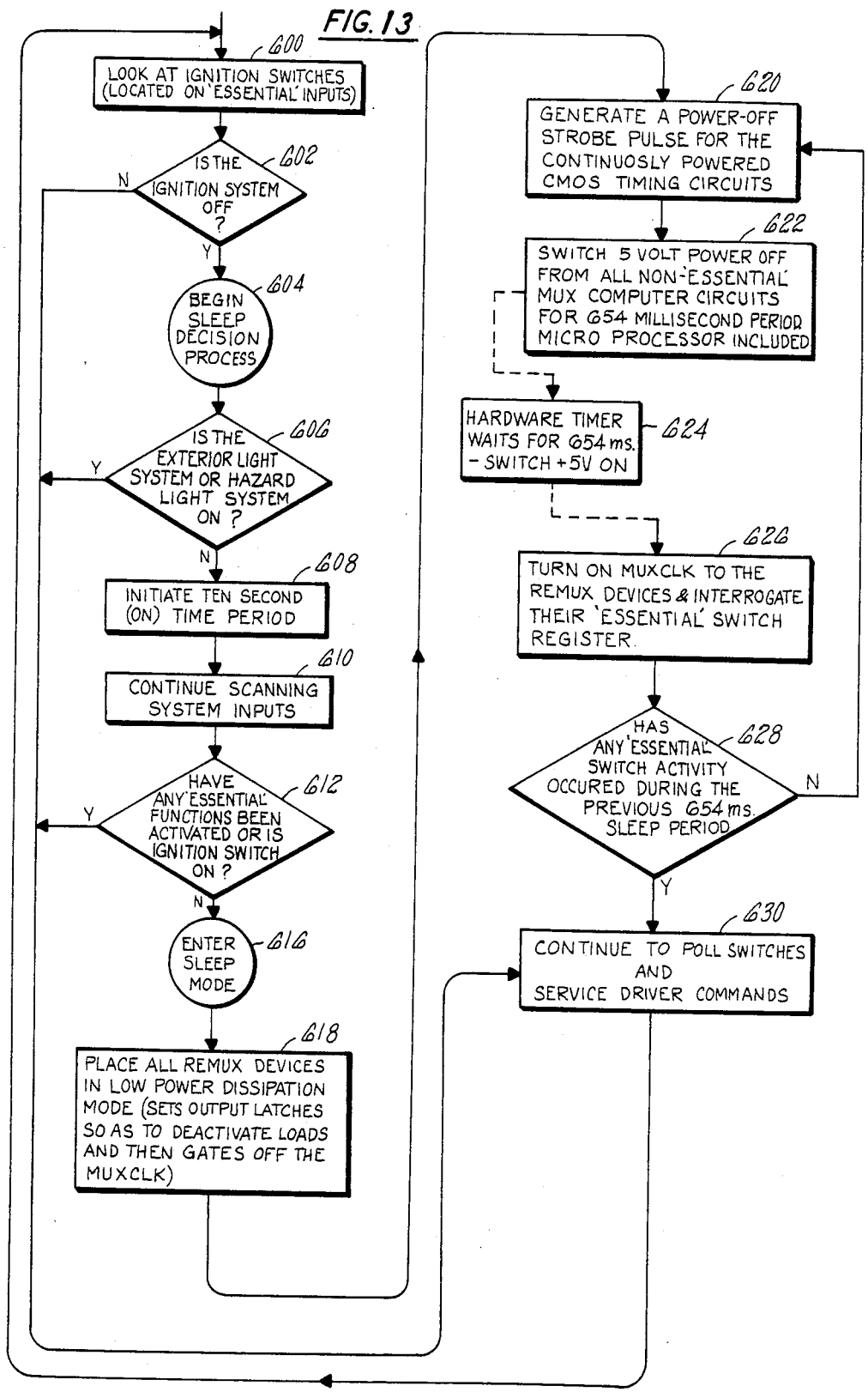

DEBOUNCE CIRCUIT PROVIDING SYNCHRONOUSLY CLOCKED DIGITAL SIGNALS

DESCRIPTION

1. Technical Field

This invention relates to debounce circuitry and more particularly to debounce circuitry for providing synchronously clocked digital signals. More particularly still, the invention relates to improved debounce circuitry for providing debounced, synchronously clocked digital signals from a single throw switch.

2. Background Art

Electromechanical switches characteristically "bounce" upon activation. This "bounce" results in multiple pulses being supplied to the logic circuits interfaced with the switches, and may cause erroneous operation of the circuitry as a result. One previous method of eliminating this "bounce" problem has involved the analog timing, i.e., RC time constants, to filter the bounce frequency. Another prior technique for eliminating "bounce" has been the use of an SR latch in combination with a single pole double throw (SPDT) input switch configuration. In this latter regard, a pair of cross-coupled NAND gates are alternately connected with the switch contact in one or the other of its two "double throw" actuated positions. This technique, of course, requires the utilization of an SPDT switch, which may by more costly than a simpler switch such as a single pole, single throw switch (SPST).

Even following removal of the multiple edges from the input signals by the aforementioned debounce circuits, most digital circuits to which the signals are being supplied still require them to be synchronized to an internal clock before they can be combined with internal logic signals.

DISCLOSURE OF THE INVENTION

One object of the present invention is to provide an improved debouncer circuit for use with a single-throw input switch. A further object of the invention is the provision of such improved debouncer circuit utilizing circuitry readily implementable as part of an integrated circuit package. A still further object of the invention is to provide an improved debouncer circuit having the capability for synchronizing the resulting debounced signals to a clock signal for subsequent use with other logic signals. It is a still further object to provide an improved debouncer circuit which employs totally digital circuit elements for interfacing with a single-throw switch.

According to the present invention, there is provided an improved debouncer circuit for providing debounced, synchronously clocked digital signals from a single-throw switch, as for instance, of the momentary contact type. A signal which is variable between two logic levels is provided by the switch for input to the debouncer circuitry. That input signal is applied as one input to an EXCLUSIVE OR gate, the other input to that gate being fed back from the Q output terminal of an output data latch having complementary Q and Q* output terminals. The Q* output terminal of the data latch is connected to the D input of that latch such that a clocking signal appearing at the clock input of the data latch serves to toggle the states of the Q and Q* output terminals. The signal appearing at either one of the output terminals Q, Q* of the output data latch may be used as the debounced signal provided to other circuitry, depending upon signal polarity needs.

The output of the EXCLUSIVE OR gate is a logic 1 only when the two inputs differ. A synchronous clock signal having a period $T_{DB}$ is supplied in both its real and inverted form to effect the requisite synchronization. Further logic including a second D-type flip-flop data latch, a NAND gate and an AND gate are interconnected with the output of the EXCLUSIVE OR gate and with the synchronous clock signals for providing a clocking signal which is extended to the clock input of the output data latch. That logic is configured such that the logic levels appearing at the output terminals of the output data latch are toggled only if the input signal voltage from the single-throw switch changes state and remains in the new state for at least a capture time interval of $T_{DB}+T_A$, where $T_A$ represents the variable interval between the initial change of state of that input signal and the next-occurring synchronous clock signal.

The output signal from the EXCLUSIVE OR gate, one phase of the synchronous clock signal and the Q output terminal of the second data latch are each applied as respective inputs to the NAND gate, the output of that NAND gate serving to provide the clocking signal applied to the output data latch. Further, the signal at the output of the EXCLUSIVE OR gate and the Q output of the second data latch are each applied as respective inputs to the AND gate. The output of that AND gate is extended to the data input of the second data latch, and the other phase of the synchronous clock signal is applied to the clock input of the second data latch to complete the circuitry for establishing the capture time interval. A preset signal may be extended to the present inputs of the output data latch and the second data latch for presetting their respective output terminals prior to the introduction of any input signals.

The debouncer circuit of the invention finds particular utility in those applications employing a single-throw switch for signal input and requiring synchronization of the resulting debounced digital signal.

BRIEF DESCRIPTION OF THE DRAWINGS

FIGS. 3A and 3B in combination are a more detailed schematic block diagram of the multiplex computer of FIG. 2, with all of the circuitry of FIG. 3A being powered in a switch-controlled manner and all of the circuitry of FIG. 3B being continuously powered;

FIG. 13 is a flow diagram of the decision and control routine associated with the "sleep" mode of system operation.

BEST MODE FOR CARRYING OUT THE INVENTION

Figure 7:
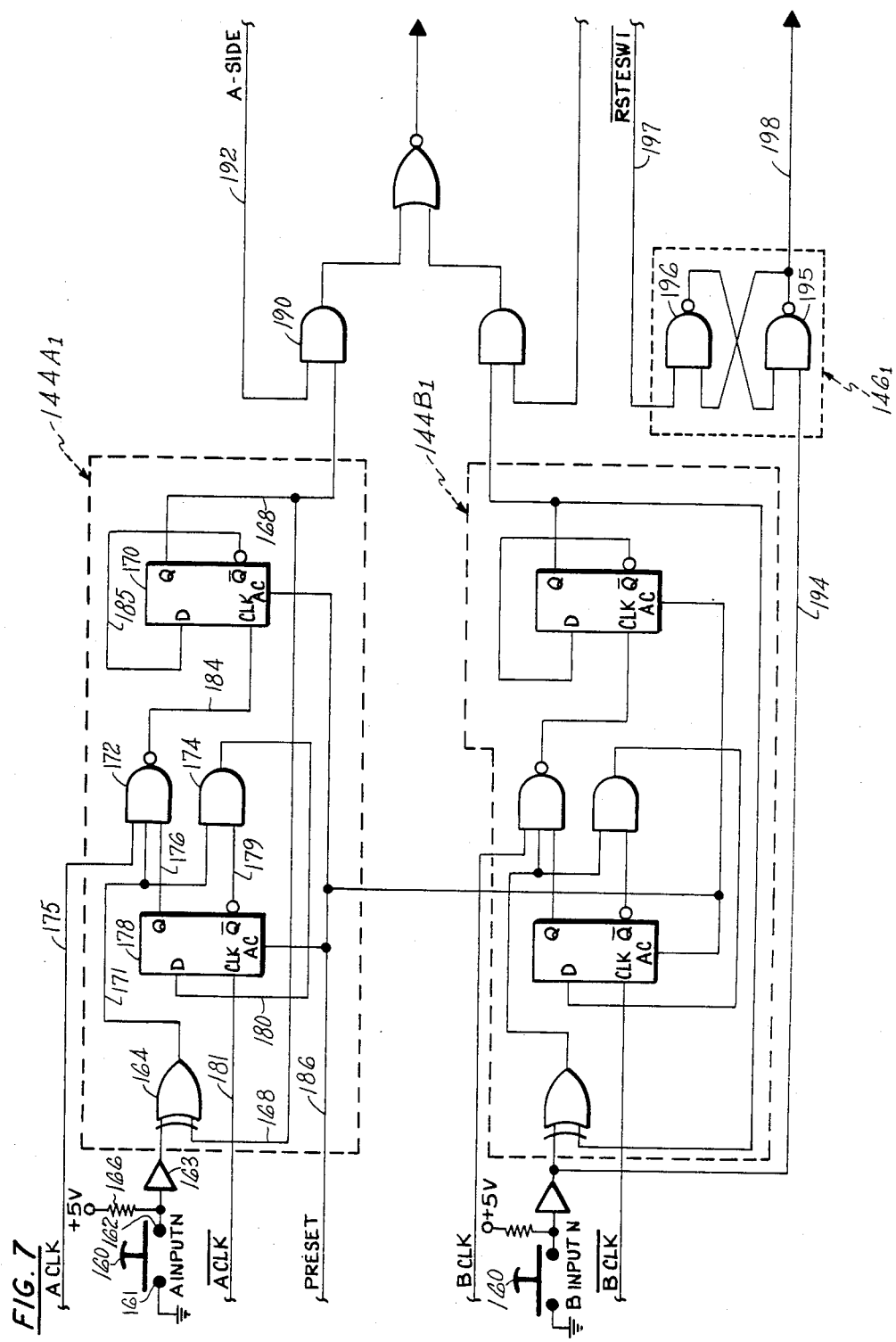
FIG. 7 is a schematic diagram of debounce circuitry and latch circuitry associated with the Remote Controller.
Figure 8:
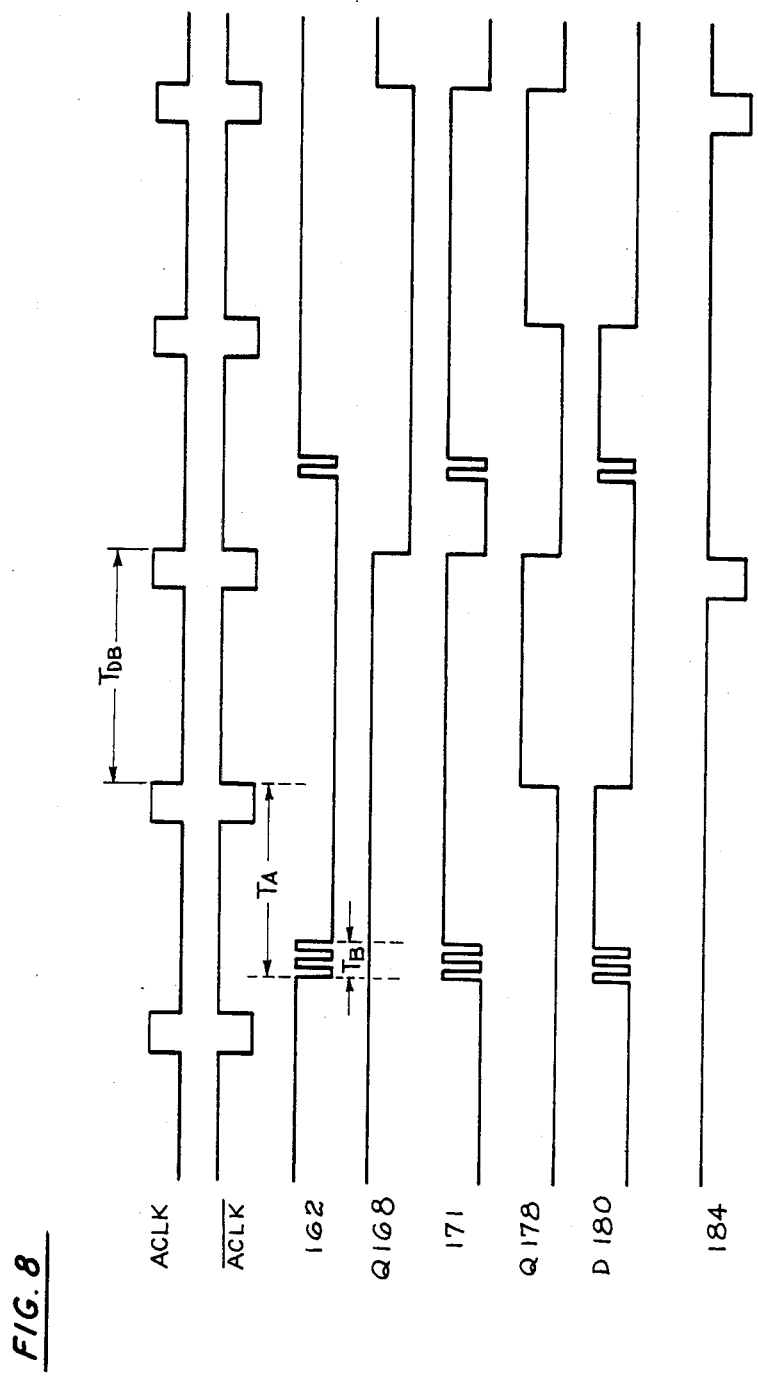
FIG. 8 is a series of waveform illustrations used in the description of the embodiment of FIG. 7.

There follows a detailed description of an exemplary system with which the debounce circuit of the invention maybe employed; however, the detailed description of the debounce circuit occurs near the middle of the specification with reference to FIGS. 7 and 8.

Figure 1:
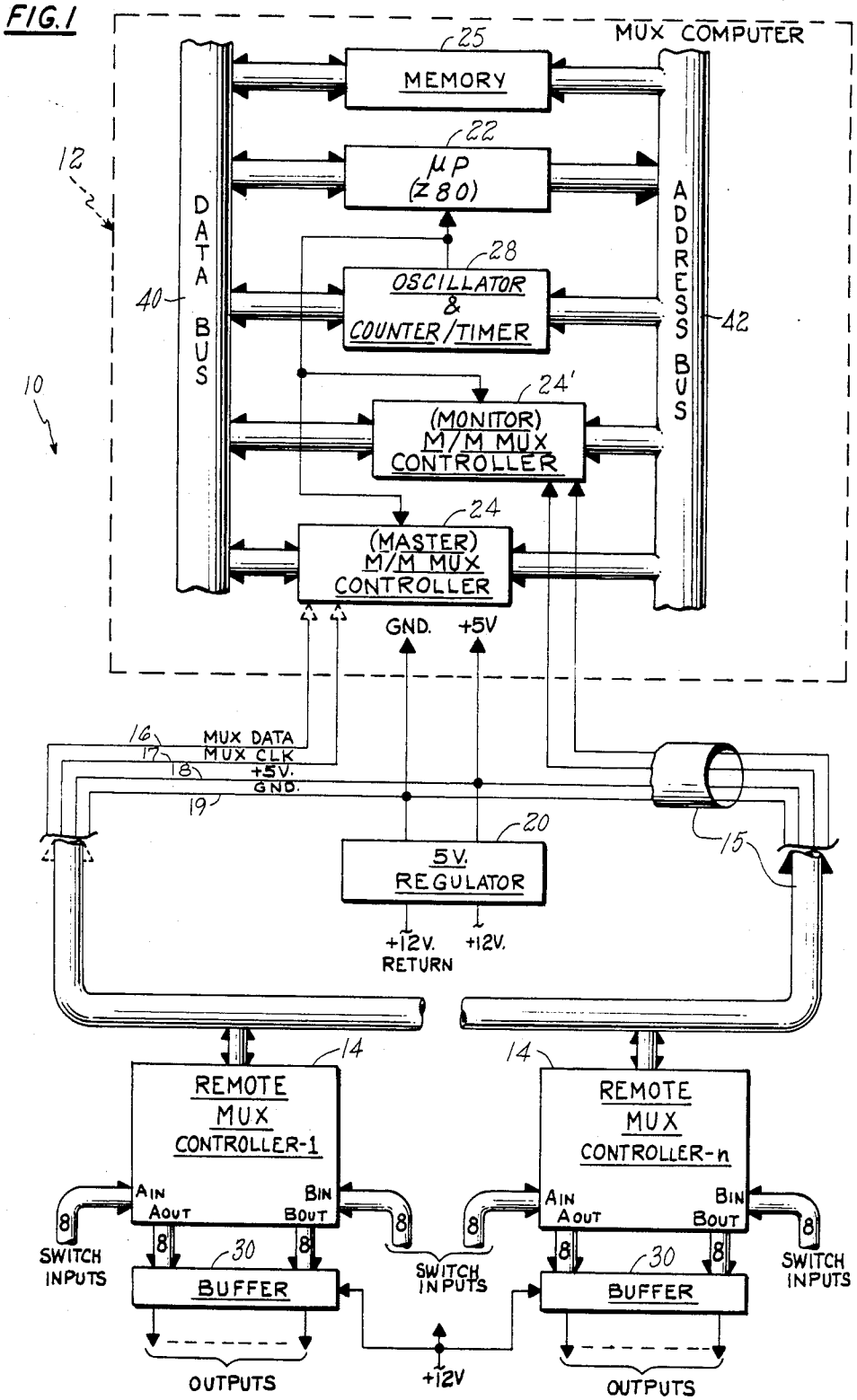
FIG. 1 is an architectural block diagram of a communication system in accordance with the present invention.

FIG. 1 is an architectural block diagram of the multiplex communication system 10 for the body electrical functions of a vehicle and incorporating the present invention. In the interest of brevity, several abbreviations or shorthand expressions will be used hereafter in place of the full descriptive name or function an an element, for instance, the word "multiplex" will often be expressed as "Mux" and a remote multiplexer will be referred to as a "Remux". Further still, the designations for various signals appearing on various conductors or at various ports in the system will be represented by descriptive abbreviations. Still further, the logic employed in the illustrated embodiment uses, in many instances, the "active-low" state of a signal for effecting some result. Although that "active-low" state is represented in the Drawings by a line or "bar" over the signal expression, that same "active-low" state is represented in the text by a * adjacent to the signal representation because of printing limitations. The multiplex communication system 10 employs a Mux computer 12 located at a central station within an automotive vehicle for providing control to and interacting with one or more remote multiplex (Remux) controllers 14 positioned at various remote locations about the vehicle. Communication between the Mux computer 12 and the Remuxes 14 is afforded via a four wire bus 15 which includes a first wire 16 for carrying bidirectional, serial, time division multiplexed data, a second wire 17 for conveying the serial multiplex clock (MUXCLK), a third wire 18 for extending a +5 volt DC supply voltage to the Mux computer 12 and the Remuxes 14 and a fourth wire 19 which serves as a signal ground (GND) for the multiplex system 10. The five volt supply voltage and the ground may be supplied by and referenced to the conventional 12 volt battery (not shown) of an automotive vehicle via a 5 volt regulator 20.

Although the multiplex communications bus 15 between the Mux computer 12 and the various Remux controllers 14 might in some applications be open ended with the Mux computer 12 being located at one end and the various Remux controllers 14 tapping in parallel "T" connection to the conductors 16-19 along the length of the bus, in accordance with an aspect of the present invention the bus 15 is formed as a loop which is terminated at its opposite ends or terminals by differing portions of the Mux computer 12 to provide increased integrity and security to the multiplex communication system 10 as will be hereinafter described. Provision of a communication bus 15 configured as a loop controlled at each end by the Mux computer 12 pemits detection of various anomolies which may occur in the transfer of information, such detection being of a nature to identify one or more breaks in the bus 15 and to further provide for maintaining transmission integrity in the event of such line break.

The Mux computer 12 located at the central station includes a standard microprocessor 22 operatively connected with a master Mux controller 24 and a monitor Mux controller 24'. The master Mux controller 24 (Master Mux) and the monitor Mux controller 24' (Monitor Mux) are each formed of custom LSI CMOS gate array circuitry and are identical in construction but differ somewhat in operation as a function of time and control mode. One end of the loop of multiplex bus 15 is connected to Master Mux 24 and the other end is connected to Monitor Mux 24'. The microprocessor 22 in the preferred embodiment is a 4 MHz Z80, such as the Mostek 3880, employing NMOS circuitry, but it will be understood that other microprocessors are similarly applicable. Memory 25 is also provided in conjunction with microprocessor 22 in the Mux computer 12, and typically includes a 1K CMOS random access memory (RAM) 26 and a 4K CMOS programmable read only memory (EPROM) 27 shown in FIG. 2. Mux computer 12 also includes oscillator and counter/timer circuitry, generally represented by the function block 28, for generating the system timing signals and for providing a "sleep mode" of operation to be described hereinafter in greater detail. Operative interconnection between the microprocessor 22, memory 25, oscillator and counter/timer 28 and the Master and Monitor Muxes 24, 24' is afforded by various control lines shown later in greater detail as well as by a data bus and an address bus, so designated, within the functional illustraton of Mux computer 12.

All of the Remuxes 14 connected to the multiplex bus 15 are of similar construction, each being an LSI gate array employing CMOS logic elements. Each Remux controller 14 is provided with significant logic capacity for "intellectual" interaction with the Mux computer 12, and typically includes provision for 16 inputs from various vehicle switches and 16 outputs to various vehicle loads, a typical switch input being that for on-off control of headlights and a typical output being a control signal for turning on or turning off the headlights. It will be appreciated that the switch inputs may derive from the need to control numerous diverse loads and functions and similarly, that the output signals will serve to control numerous diverse types of loads. The architecture of each Remux 14 is such that it is divided into halves, each half having eight inputs and eight outputs and having a separate address. More specifically, one side of a Remux 14 is designated the A side and is provided with an even numbered address and the other side is designated the B side and is given an odd number address which is numerically 1 greater than the A side address. The outputs from Remuxes 14 to the various vehicle loads typically provide low voltage control signals to various control elements or buffers 30 which in return respond by connecting or disconnecting the vehicle 12 volt supply to the load being controlled.

Figure 5:
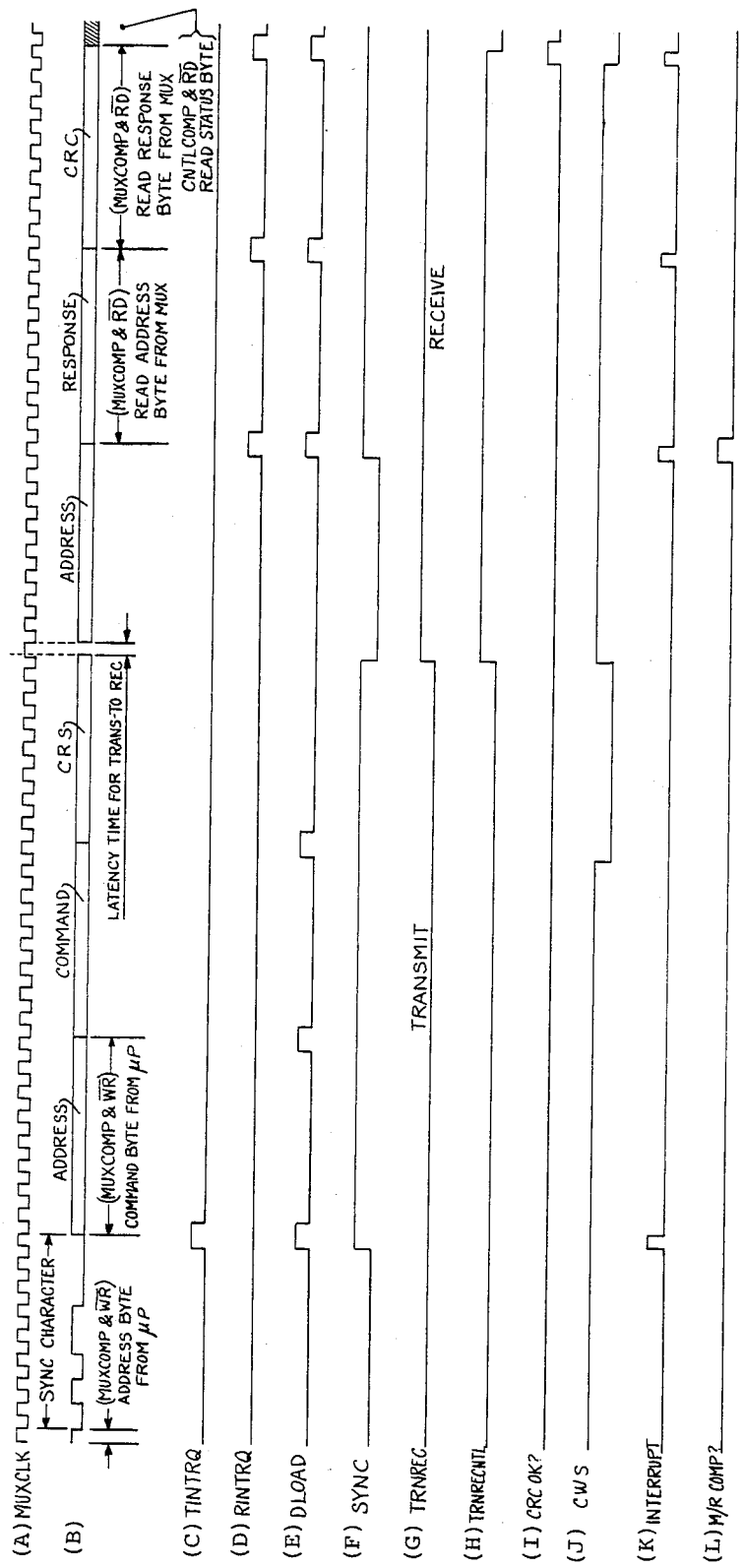
FIG. 5 is a series of waveform illustrations A-L of particular signals associated with the Controller illustratead in FIG. 4.

The multiplex communication system 10 employs a communications protocol illustrated in FIG. 5B for use in the data communications between the Mux computer 12 and the Remuxes 14. This data protocol is intended to enhance the integrity of the communications system through an efficient detection of communication errors and/or anomolies. A thorough description of this data protocol is contained in U.S. application Ser. No. 469,591 for Vehicle Multiplex System Having Protocol/Format for Secure Communication Transactions filed Feb. 24, 1983 by William Floyd and assigned to the same assignee as the present application, and is incorporated herein by reference. Briefly, each communication transaction on the Mux data line 16 of multiplex bus 15 includes seven characters or bytes of eight bits each, the first byte being a sync byte, the following three bytes comprising a command message from the master controller 24 consisting of an address byte, a command byte and a CRC error detect byte and the final three bytes comprising a reply message from a Remux 14 consisting of an address byte, a response byte and a CRC error detect byte. Although the system 10 as presently configured has the potential for controlling as many as 128 Remuxes 14, each having two separate addresses, it will be understood that usually far fewer Remuxes 14 are actually required, only two being illustrated in the FIG. 1 embodiment.

Figure 2:
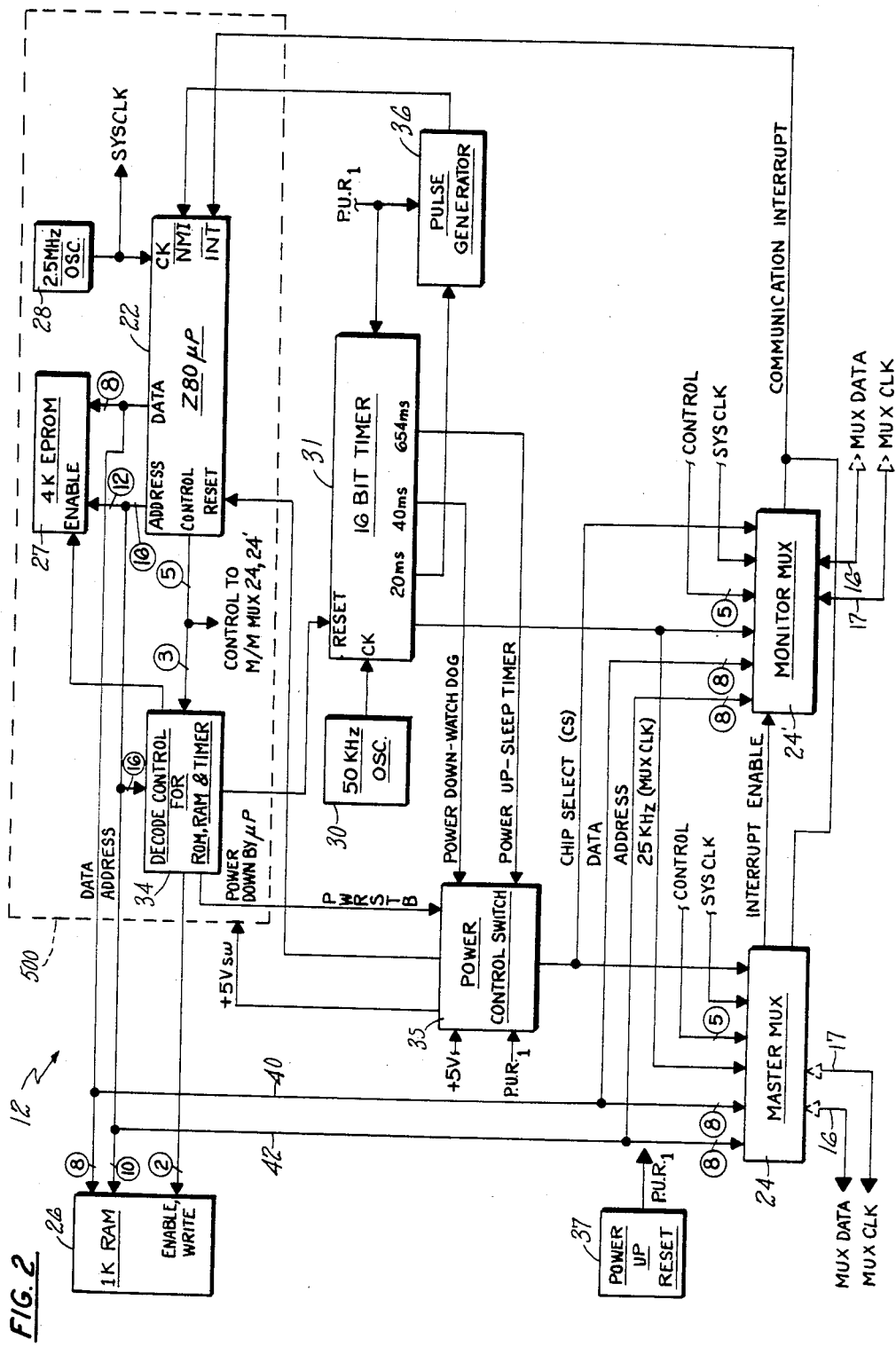
FIG. 2 is a generalized schematic block diagram of the multiplex computer comprising part of the embodiment of FIG. 1.

Referring briefly to FIGS. 2, 3A and 3B, the system clock (SYSCLK) for controlling the timing of the microprocessor 22 and various other elements of the Mux computer 12 is typically of 2.5 MHz and is provided by an RC oscillator 28 of conventional design. Further, a similar type of RC oscillator provides a 50 KHz source 30 which is divided by two in the initial stage of a multistage binary counter 32 to provide a 25 KHz clock signal which is used as the multiplex clock (MUXCLK). Inasmuch as the serial Mux data appearing on multiplex bus 15 is clocked at a 25 KHz rate, the period of each bit will typically be 0.04 ms and the period of an eight-bit byte is 0.32 ms. Interactions between the microprocessor 22, its program stored in EPROM or PROM 27, the data stored in RAM 26, and the Master and Monitor Muxes 24, 24' is conducted at a rate determined by SYSCLK. Interaction between the microprocessor 22 and the memory elements 26 and 27 is determined by conventional decode control logic 34 which additionally includes timer decode logic for providing certain control signals to timer circuitry and power control switch circuitry generally represented by the blocks designated 31 and 35, respectively in FIG. 2 to be described hereinafter in greater detail. The processor 22 is interrupt driven, a nonmaskable interrupt (NMI)* being provided by the timer 31 at approximately 20 ms intervals. The hardware timer 31 includes two, eight-stage, divide-by-256 counters, 32 and 33, respectively of FIG. 3B. A timing signal occurring at 20 ms intervals from the timer 31 is applied to pulse generating circuitry, generally designated 36 in FIG. 2 for providing the NMI* signal. Additionally, upon initial powering-up of the multiplex system 10, as by connecting of the vehicle's battery cable, a conventional power up reset signal PUR$_1$ is generated by conventional circuitry represented by block 37. This PUR$_1$ signal may also be applied to the pulse generating circuitry 36.

As is evident in FIGS. 2, 3A, and 3B, processor 22 utilizes eight bidirectional data lines $D_0$–$D_7$ for the parallel output and input of data to the memory elements 26, 27 and the Master and Monitor Muxes 24, 24'. The processor also includes 16 address lines $A_0$–$A_{15}$ for providing addressing signals to the memories 26, 27 and Master and Monitor Muxes 24, 24', as well as to the decode control logic 24. The data bus between processor 22 and the Master and Monitor multiplexers 24, 24' is designated 40 and the corresponding address bus between those elements is designated 42 and consists of $A_0$–$A_9$. Five further signal lines are provided at the processor 22 and at the Master and Monitor multiplexers 24, 24', and are designated RD*, WR*, IORQ*, M1*, and INT*. The RD* signal is issued by processor 22 when it wishes to read data from memory 25 or an I/O device such as the multiplexers, 24, 24'. Depending on which is addressed by processor 22, one or the other of the multiplexers 24, 24' is issued the RD* signal to gate data onto the data bus 40 from multiplexes 24, 24'. The WR* signal provided by processor 22 indicates that the data bus 40 holds valid data to be stored in the addressed memory 26, 27 or I/O device multiplexers 24, 24'. The IORQ* signal indicates that the address bus 42 contains a valid I/O address for an I/O read or write operation. This signal is also generated with an M1* signal when an interrupt is being acknowledged to indicate that an interrupt response vector can be placed on data bus 40. The M1* signal indicates that the current processor cycle is the OP-Code Fetch cycle of an instruction execution, and it also occurs with IORQ*, as mentioned, to indicate an interrupt acknowledge cycle. The INT* signal is one generated by a multiplexer operating in its Master Mode, as Master Multiplexer 24, and is directed to processor 22 when an interrupt is being requested. This request is honored by processor 22 at the end of the current instruction being executed by the processor.

The processor 22 issues a further control signal designated MREQ* which is extended to the RAM and EPROM decoding circuitry and to the MNI* pulse generator for selecting either ROM or RAM when the address holds a valid address for a Memory Read or Memory Write operation, and enabling the NMI* generator to provide a pulse for the NMI* input.

Referring to FIG. 3B, it will be noted that Master and Monitor Multiplexers 24 and 24' each include address input lines ADDCMP 1–7 for fixing or hardwiring their respective addresses. With respect to Master Monitor 24 it will be noted that all of the ADDCMP 1–7 inputs are tied to ground (logic 0) except for ADDACP 4 which is at +5 volts (logic 1). A similar situation exists with Monitor Multiplexer 24' except that the input ADDCMP 4 is a logic 0 and input ADDCMP 5 is a logic 1. Accordingly, the Master and Monitor Muxes 24, 24' are separately identified and identifiable in their respective communications with processor 22.

Each of the Master and Monitor Mux modules 24, 24' also includes an input designated MR which receives a signal designated PUR$_2$ obtained in a manner to be hereinafter described and which effects a resetting initialization of the internal control registers and timing of the respective Muxes 24, 24'.

At this juncture it is appropriate to further consider the operating protocol of the multiplex system 10 particularly as regards serial data multiplex transactions between the Mux computer 12 and the Remuxes 14. In accordance with the routine of programmed instructions contained in ROM 27, the processor 22 scans the various Remuxes firstly to establish what, if any, input switches have been actuated, and secondly to effect the requisite output control action to the appropriate loads.

To effect this control, the processor 22, which typically provides and receives operating addresses and data in a parallel manner, utilizes the Master Multiplexer 24 to convert the address and command issued to the respective Remuxes 14 into a serialized data format and to reconvert the serialized address and response data issued by the Remuxes 14 into a parallel format for transmission on the parallel data bus 40 to processor 22. As mentioned earlier, a typical transaction between the Mux computer 12 and a Remux 14 includes, as illustrated in the trace of FIG. 5B, the issuance of a sync byte followed by an address byte, a command byte and an error check (CRC) byte in the message sent from the Master Mux 24 to a particular Remux 14. Subsequently the addressed Remux 4 will, or should, reply on Mux data line 16 with an address byte, a response byte and an error check (CRC) byte. The address byte sent by the Master Mux 24 contains the address of a selected half of one of the Remuxes 14. The command byte instructs the addressed Remux to respond with various input signals which it may have received by the actuation of outside switches and/or to provide output control signals to the output load devices connected to that particular half of the Remux. A cyclical redundancy error checking technique utilizes the address and command bytes for generating an error check byte which is transmitted to the addressed Remux. The Remux 14 which responds is presumably that which was addressed by Master Mux 24 and the response is initiated with an address byte which indicates the address of the particular responding Remux. That byte is followed by a response byte which indicates the response taken by the particular Remux to the recieved command message; typically revealing the status of various input switches and actuation of output loads. In this regard, the status of switch inputs and/or output loads is typically determined by sampling latched switch inputs and actuation responses of load outputs. The response byte will typically also include an indication of whether or not the particular Remux, having done its own error checking of the incoming message from Master Mux 24, "agrees" with its error check byte. Finally, the error check byte sent by the Remux 14 will have been calculated using a CRC technique using its Address and Response in reply message. The multiplexer does its own error checking on the Remux Reply. Following each such transaction there may or may not be a period of bus latency in which all "ones" are written while a further instruction is awaited from processor 22.

Figure 4:
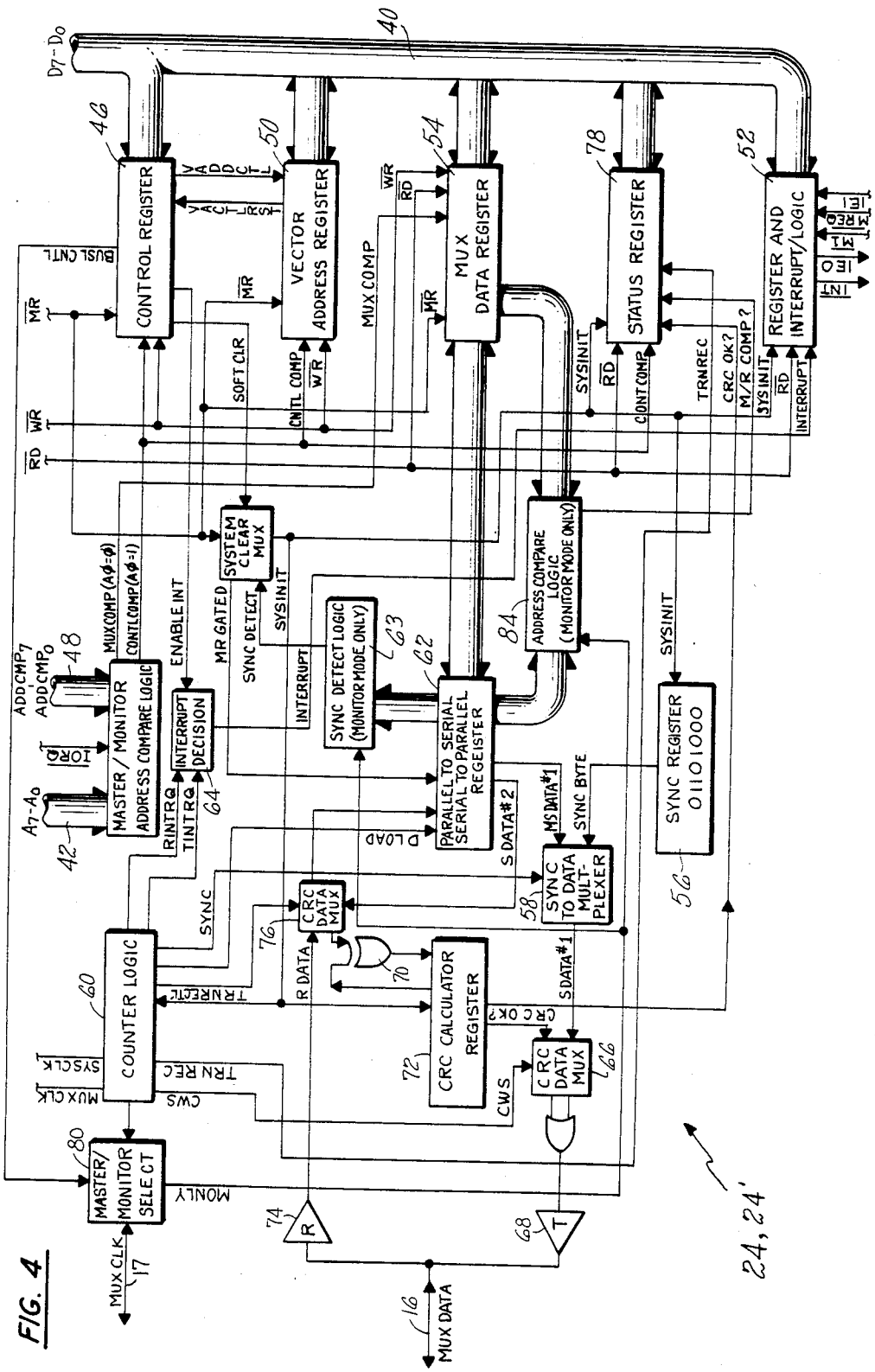
FIG. 4 is a schematic block diagram of a Master/-Monitor Mux Controller used in the multiplex computer.

Referring now to FIG. 4, the Master and Monitor Muxes 24, 24' are considered in greater detail. Because both are of identical architecture, they are discussed and illustrated as one in FIG. 4, though they are capable of functioning differently from one another in accordance with the invention. Accordingly, the discussion will first be from the standpoint of the Master Mux 24 and subsequently the Monitor Mux 24'. Further in FIG. 1 the bus 15 and its MUX DATA line 16 and MUXCLK line 17 are each shown with arrows at both ends, the solid arrowheads depicting the general flow in the presently discussed and illustrated configuration, and the dotted arrowheads depicting the reversed configuration.

When power is initially applied to the Muxes 24 and 24', their initial states will be that of a monitor. This means they are both in the receiver or listener mode and are searching for the SYNC byte on the serial Mux data line 16. To convert Mux 24 to the Master status, its eight bit control register 46 must be programmed. This is accomplished by processor 22 addressing the Mux 24 using the Address Bus 42 and comparing the address in the Address Compare Logic 48 with the device's address established at the inputs ADDCMP 1-7. Assuming further that the $A_0$ bit of the address sent is a 1, a CNTLCOMP signal is issued to the control register 46 such that when the processor 22 executes a write operation, WR, control data will enter register 46 from data bus 40. The programming of the control register 46 for the Master Multiplex function includes setting bit number 4 to a 1 to reset the internal logic in the Mux module. Once completed, bit number 4 automatically resets itself. Bit number 2 of register 46 is set to a 1 to enable the next byte on Data Bus 40 to be written into the Vector Address Register 50. Once completed bit number 2 automatically resets itself. Bits number 0, 1 and 3 must be set to 1 for the Mux to operate as a master. Specifically, if bit number 0 is a 1, the device is a master, otherwise it is a monitor. With bit number 1 as a 1, the Mux clock, MUXCLK, is transmitted on line 17 of bus 15. With bit number 3 as a 1, the Interrupt Logic 52 is enabled. Bit numbers 5, 6 and 7 may be programmed to any state since they are not used.

Following programming of Control Register 46 such that the device 24 will act as a Master Mux, it is again addressed by processor 22 and the multiplexing operation is initiated by writing the appropriate data byte (Address byte) into the Multiplex Register 54. The address comparison at logic 48 for entering data in Multiplex Register 54 is achieved when $A_0$=a logic 0, and data is entered in the register during a write, WR, operation. Then, once the Address byte is written into the Multiplex Register 54, Master Mux 24 will start transmitting the SYNC character or byte (00010110) on the serial bus 16. The SYNC byte is derived from a SYNC Register 56. Synchronization of the SYNC byte and the subsequent data bytes transmitted by Master Mux 24 is effected by a conventional synchronization circuit 58 receiving a synchronization control signal SYNC, from counter logic 60 which responds to the 25 KHz Mux CLK for providing the appropriate phasing to the SYNC signal. Once the SYNC Byte is finished being transmitted on data line 16, the Address byte stored in register 54 will be converted from parallel to serial by register 62 and is then automatically appended to the SYNC byte on the serial bus via synchronizing circuitry 58. An interrupt, INT*, is then generated.

The interrupt signal INT* is requesting that the processor 22 stop its existing action and service the MUX 24. A TINTRQ signal from the counter logic 60 is applied to Interrupt Decision logic 64 and being extended therefrom as an interrupt request signal to the Interrupt Register and Logic 52 for extension as signal INT to the processor 22. Sometime after an interrupt is requested by the Master Mux 24, the processor 22 will send out an "interrupt acknowledge" (MI* and IORQ*). During this time, the Interrupt Logic 52 of Master Mux 24 will determine the highest priority device which is requesting an interrupt. This is simply the device with its interrupt enable input, IEI, at a logic 1 and its interrupt enable output, IEO, at a logic 0. It will be noted in FIG. 3B that the IEI input of Master Mux 24 is tied to +5 volt and its IEO output is tied to the IEI input of the Monitor Mux 24'. The Interrupt Logic 52 is such that when IEI is a logic 1, no other devices of higher priority are being serviced by an interrupt service routine from the processor 22. Additionally, the IEO signal from the Interrupt Logic 52 will be a logic 1 only if the IEI input to that Mux is a logic 1 and the processor 22 is not servicing an interrupt from that multiplexer. Thus, when the processor 22 is servicing an interrupt from that multiplexer, its IEO signal is a logic 0 and will serve to place the IEI inputs of other multiplexers to which it is connected to a logic 0, thereby making them subservient in the priority of interrupt servicing. To ensure that the interrupt priority daisy chain is stabilized, Multiplex devices are inhibited from changing their interrupt request status when M1* is active (0). The highest priority device places the contents of its Interrupt Vector Address Register 50 onto the data bus 40 during "interrupt acknowledge". After an interrupt by the Master Multiplex is acknowledged, that multiplexer is "under service". The IEO of this device will remain low until a return from interrupt instruction (RETI=$ED_H4D_H$) is executed while the IEI of the device is a logic 1. If an interrupt request is not acknowledged, IEO will be forced high for one M1* cycle after the multiplex 24 decodes the Op code "$ED_H$". This action guarantees that the two bytes RET 1 instruction is decoded by the proper Mux device.

When the processor 22 receives the interrupt, it has one byte time (0.32 ms) in which to write the Command byte into the Multiplex Register 54. If this time has elapsed before data is written into the register 54, the data on the serial bus 16 following the Address byte will be nonvalid. As was the case with the Address byte, the Command byte will be transferred from register 54 through parallel to serial converter register 62 for output to the serial data line 16 via the data multiplexing sync circuit 58, the CRC data Mux gate 66 and the transmitter circuitry 68.

As the serial Address and Command data bytes are being read from register 62 onto the serial data line 16, they are also being provided on the line designated "SDATA#2" to an input of an EXCLUSIVE OR gate 70 having its output connected to an input stage of CRC calculator register 72. The other input to the EXCLUSIVE OR gate 70 is provided by a selected one of the output stages of the CRC register 72 to perform the CRC calculation function in accordance with the description provided in the aforementioned application Ser. No. 469,591. Immediately following transmission of the Command byte, the CRC byte will have been generated in register 72 and is serially read therefrom and through the CRC Data Mux circuit 66 which has been enabled by a CRC word select signal CWS from the counter logic 60.

Upon completing the transmit mode, the Master Mux 24 automatically switches into the receiver mode. In the receiver mode, the Remux Address byte will be the first character to be received, after which an interrupt will be generated to signal the processor 22 that it is time to read that byte. Once again the processor has 0.32 ms in which to read the byte, after which the byte is no longer valid. The data being received from line 16 by Master Mux 24 first enters through receive buffering circuitry 74 and is gated through logic circuitry 76 to the serial to parallel register 62. A transmit/receive control signal TNRECNTL applied to gate circuit 76 provides for the received data, R DATA, to be passed to serial to parallel register 62 and also provides that that data be extended to an input of the EXCLUSIVE OR 70 for use in the calculation of a CRC byte during the receive mode.

In the receive mode, the second byte will be the Remux response byte and it will be received in the same manner as the remote address byte. It too will signal the processor 22 with an interrupt indicating that valid data can then be read. The final byte received by Master Mux 24 will be the Remux's CRC byte. This byte will be compared to the byte generated by the CRC calculator 72 from the incoming data stream during the receive mode. If the two bytes compare, bit number 0 in the Master Muxes status register 78 will be a 0, whereas if the two CRC bytes do not compare bit number 0 in register 78 will be a 1. Also, an interrupt is again generated to signal the processor 22 that the status register should be read. Reading the status register 78 serves to reset that register. In addition to the state of bit number 0 in status register 78 serving to indicate the correctness or incorrectness of the CRC from the Remux, the state of bit number 1 will be indicative of operation in the transmit or the receive mode, the state of bit number 2 will be indicative of the correctness or incorrectness of the CRC comparison if the device is operating in the monitor mode as will be discussed hereinafter. The state of bit number 3 signifies whether or not the Master Mux and Remux addresses compare when the device is operating in the monitor mode as will be described hereinafter and the state of bit number 4 is used to signify when a transaction has been completed.

When the status register 78 has been read and reset, the Master Mux 24 will switch back to the transmit mode and will send ones onto the serial bus 16; thus waiting for a write, WR*, from the processor 22 to initiate another transaction.

Brief reference to the timing diagram provided by FIGS. 5A-L further correlates the timing of the above-described functions with the various parts of a complete transaction performed by Master Mux 24. It will be noticed in 5K that a single interrupt is generated during the transmit mode, whereas three separate interrupts are generated during the receive mode. It will also be noticed that the control signal DLOAD is 5E for loading parallel data into the parallel to serial register 62 occurs at the beginning of the address, command and CRC bytes respectively during the transmission mode, whereas that function to convert from serial to parallel occurs at the end of the address, response and CRC bytes during the receive mode. The determination of whether or not the CRC byte received by Master Mux 24 was correct is determined by the signal CRC OK? appearing in 5I at the end of the CRC byte appearing at the end of the transaction. A Master Address/Receive Address comparison signal M/RCOMP? occurs at the end of the receipt of the Remux address during the receive mode of the transaction; however, this function is performed only by Monitor Mux 24' as will be discussed hereinafter.

Referring now the operation of a multiplex controller in its monitor mode, as represented by Monitor Mux 24', the monitor mode may be attained either upon power-up initialization or by writing a 0 into bit numbers 0 and 3 of the control register 46. In this mode the multiplexer functions only as a receiver or listener, and interrupts to the processor 22 are never generated. In such monitor mode the INT* is tri-state. After establishing a particular Mux as a monitor 24', an output line designated bus listen control BUSLCNTL from the bit number 0 position of control register 46 serves to control Master/-Monitor select circuitry 80 for generating a control or gating signal MONLY which is a 1 when the device is to operate as a Master Mux and is a 0 when it is to operate as a monitor. The MONLY control signal is extended to those portions of the Master/Monitor Mux circuitry which are to provide different modes of operation depending upon whether the chip is configured as a master or as a monitor. When configured as a Monitor Mux 24', the device operates only as a receiver and therefore is in the "sync search" state awaiting receipt of a Sync byte at the "downstream" end or terminal of the serial data line 16. When the Sync byte is received, it is recognized by Sync Detect Logic 63 and the Monitor Mux is initalized for enabling the following three bytes on the serial bus to be acknowledged. The first byte received after the Sync byte is the Remux address transmitted by the Master Mux. This byte is stored in the data buffer, MUX Data Register 54, for comparison later with the address byte sent by the responding Remux 14. Further, that first byte is gated through the CRC data Mux 76 and EXCLUSIVE OR gate 70 to the CRC calculator 72. The next byte received is the command from the Master Mux 24 and it also is gated through CRC data Mux 76 and EXCLUSIVE OR 70 into the CRC calculator 72 for determining a CRC byte value at the monitor. The third byte received by monitor 24' will be the Master's CRC. This CRC byte is also conducted through the CRC data Mux 76 and the EXCLUSIVE OR 70 to the CRC checker 72 to determine whether or not the CRC bytes compare. If the results are the same, bit number 2 in the status register 78 will be set to a 0 and if not, a 1 will be placed in bit number 2 of that register. After this operation, the CRC calculator 72 is automatically cleared.

The fourth byte received by Monitor Mux 24' is the address byte sent by a responding Remux 14. This byte is compared to the Address byte previously sent by Master Mux 24 and presently stored in Mux data register 54. The comparison of the two address bytes occurs in Address Compare Logic 84 which is active only if the Mux chip is acting as a monitor 23'. If the two address bytes compare, bit number 3 of the Status Register 78 will be set to 0 and if not, a 1 will be place in bit number 3 of that register. Byte 4 received by Monitor Mux 24' is also passed through CRC data Mux 76 and EXCLUSIVE OR gate 70 into the CRC calculator 72 for use in determining a CRC byte. The fifth byte received by Monitor Mux 24' is the Response byte issued by the responding Remux 14. This response byte is directed through CRC data Mux circuit 76 and EXCLUSIVE OR gate 70 to the CRC calculator for determination of the CRC error byte.

The sixth byte received by Monitor Mux 24' is the CRC byte sent by the responding Remux 14. This byte is also directed through CRC data Mux 76 and the EXCLUSIVE OR gate 70 for comparative combination with the CRC byte then stored in register 72. In the event the CRC byte transmitted by the Remux compares with that calculated in the Monitor Mux 14, a 0 will be set in the bit number 0 position of the status register 78, but if the bytes do not compare, a 1 will be placed in the bit number 0 position of the status register. Upon completion of this transaction, the SYNC search mode will be restored; thus enabling a new operation to begin.

Although the Monitor Mux 24' is not capable of generating an interrupt to the processor 22, the processor will instead interrogate the Monitor Mux 24' followin each transaction to ascertain whether or not the address and CRC checks performed by the monitor indicate accuracy, integrity and consistency in the transmissions between the Master Mux 24 and Remux 14. In the event errors are reflected by one or more of these checks, the processor 22 is capable of taking various forms of corrective action.

Prior to a further discussion of the centralized control of the multiplexing system 10 by Mux computer 12, the circuitry of a representative Remux 14 will be described in somewhat greater detail with reference to FIGS. 1 and 6. Firstly referring to FIG. 6, a representative Remux 14 is illustrated in functional block diagrammatic form. The Remuxes 14 are provided by LSI gate array logic configured to provide the requiste functions discussed herein. Each Remux 14 is connected with the Mux bus loop 15 via parallel "T" connections with the respective four wires 16–19 of that bus. The provision of +5 volts and ground is not shown but is implied. The bidirectional data line connecting Remux 14 with the Mux data line is designated 16' and the line connecting the Remux with the MUXCLK line 17 is designated 17'. Appropriate circuitry 120 is located in line 17' for buffering the received MUXCLK. Similarly, in line 16' there is provided Receive buffering circuitry 121 and Transmit buffering circuitry 122 connected in complementary relationship. The incoming data on line 16' and the MUXCLK on line 17' are supplied as inputs to an eight bit serial-to-parallel and parallel-to-serial shift register 125 which is responsible for providing the appropriate conversions of data from one form to the other in response to an appropriate control signal CRTL. As used in the description of FIG. 6, the control signals CRTL are provided by control logic 128 and may provide a variety of control functions. The following discussion is intended to reveal the characteristics of those various control functions. Each of the Remuxes 14 on the Mux bus 15 awaits receipt of a Sync byte from the Master Mux 24 as an indication of a transaction to follow which may or may not be addressed to a particular Remux 14. The Sync byte is received on Mux data line 16' and entered in the register 125 where it is parallel connected via bus 130 to control logic 128 capable of recognizing the Sync byte pattern and providing a resulting control signal. Accordingly each Remux 14 is then synchronized to receive the next byte in the transaction from the Master Mux 24, that being an Address byte containing the address of a particular one of the Remuxes 14.

Each of the Remuxes 14 will have a different preassigned address stored in address latch 132. The address latch 132 and the preprogramming of an address thereinto will be described later in greater detail. The address byte received on the serial data line 16' is compared by the Control Logic 128 with the Remux Address previously stored in address latch 132. The address for only one of the Remuxes 14 should compare and accordingly, the other Remuxes are effectively dormant for the remainder of that particular transaction. However, for the Remux 14 actually addressed, the bidirectional transfer of data will continue.

During the receipt of the address byte from Master Mux 24, that byte will be directed through CRC data Mux circuitry 134 and an EXCLUSIVE OR gate 136 into CRC calculating and checking circuitry 138 in the manner previously described for the Master and Monitor Muxes 24, 24'. Upon determination that a Remux 14 is the particular one being addressed, the next incoming byte, the Command byte, will also be directed through circuit 134 and the EXCLUSIVE OR gate 136 into the CRC circuitry 138. Serial to parallel circuitry 125 applies the eight bits in the command byte to the A side or the B side latched outputs for additional decoding prior to latching outputs 140A, 140B respectively. The Command byte data may also be applied to the Control Logic 128 via bus 134 for effecting certain control actions, such as Read A Side A or B Side switches; Read Essential switches; and Diagnostic Byte. As was earlier mentioned, each Remux 14 is divided into halves, one half being designated the A side and the other half being designed the B side. Although a particular Remux 14 has a singular distinct address relative to all of the other Remuxes 14, the distinction between A side and B side within a particular Remux is determined by whether the least significant bit in the address is even or odd. An even LSB designates the A side of a Remux 14 and an odd LSB designates the B side of the Remux. Internal logic associated with Control Logic 128 is capable of determining whether the LSB is even or odd and thus the address latch 132 is only required to provide the seven more significant bits of the address. When both the address byte and command byte have been received by Remux 14, a resulting CRC value has then been determined in the calculator 138. The next byte to be received is a CRC byte transmitted by Master Mux 24 and it is introduced to the checking circuitry 138 via CRC data Mux 134 and the EXCLUSIVE OR gate 136 to determine whether the two CRC bytes compare. Unless they do compare, the Command byte previously received will not be executed. However, assuming the CRC bytes do compare, one of the following commands will be executed; (1) Send all A-side debounced switch inputs; (2) Send all B-side debounced switch inputs; (3) Send diagnostic byte for even address; (4) Send diagnostic byte for odd address; (5) Send undebounced B-side switch inputs; (6) Write a 1 to a specific output line for the A side or for the B side; (7) Write a 0 to a specific output line for the A side or for the B side; (8) Write a 1 to all eight output lines for the A side or for the B side; (9) Write a 0 to all output lines for the A side or for the B side. The execution of these commands requires converting the serial Command byte to parallel data applied via bus 130 to the Control Logic 128 so as to set certain A- or B-side latched outputs to a particular state or to condition the certain gating 142 such that it can transmit input switch states from either the A-side debounced switch register 144A, the B-side debounced switch register 144B or the essential switch register 146 to the parallel-to-serial register 125 via parallel bus 148. Further, a control signal CTRL from the Control Logic 128 may condition the register 125 to send a particular diagnostic byte.

The Reply half of the handshake transaction between Master Mux 24 and Remux 14 begins with the Address byte identifying the particular Remux 14 and further, the A or B side thereof, which is responding. This address is derived from the address latch 132 and Control Logic 128 and is parallel loaded into register 125 for serial shifting out via serial line 150 which is extended through the transmit buffer 122 to the Mux data line 16'. During this reply transmission of the Remuxes address, it is also entered into the CRC calculator 138 via CRC data Mux 134 and the OR gate 136 in a manner before described. The response byte next sent by Remux 14 may be coded in a variety of ways to indicate the response taken by the Remux to the previously received command byte. For instance, if either the A side or the B side debounced switch inputs 144A, 144B or the undebounced B side switch inputs from register 146 were requested, each bit of the eight bit Response byte will signify and an input state of a respective one of the eight input switches. Each of the responses to each of the remaining commands discussed above is a uniquely coded eight bit byte indicative of a positive acknowledgement that a commanded output action has been effected. In this latter regard, the output latches are monitored to determine that they were set to the state commanded and a coded Response byte indicating compliance is then formulated and transmitted. As with the Address byte, the Response byte is formed in shift register 125 and is serially shifted out on line 150 for transmission on line 16'. Similarly, the response byte is entered in CRC calculator 138 for determination of a Reply CRC byte. Upon formulation of that CRC byte, it is parallel shifted via bus 152 gating logic 142 and bus 148 into register 125 for serial transmission via line 150 to the Mux data line 16'. Upon completion of transmission of the CRC byte from Remux 14, the transaction is completed and the Remux returns to a state in which it awaits another sync byte and more specifically its address from the Master Mux 24. The Remux 14 is of course provided with power-on resetting circuitry (not shown) for initializing the circuitry each time it is powered up.

Figure 6:
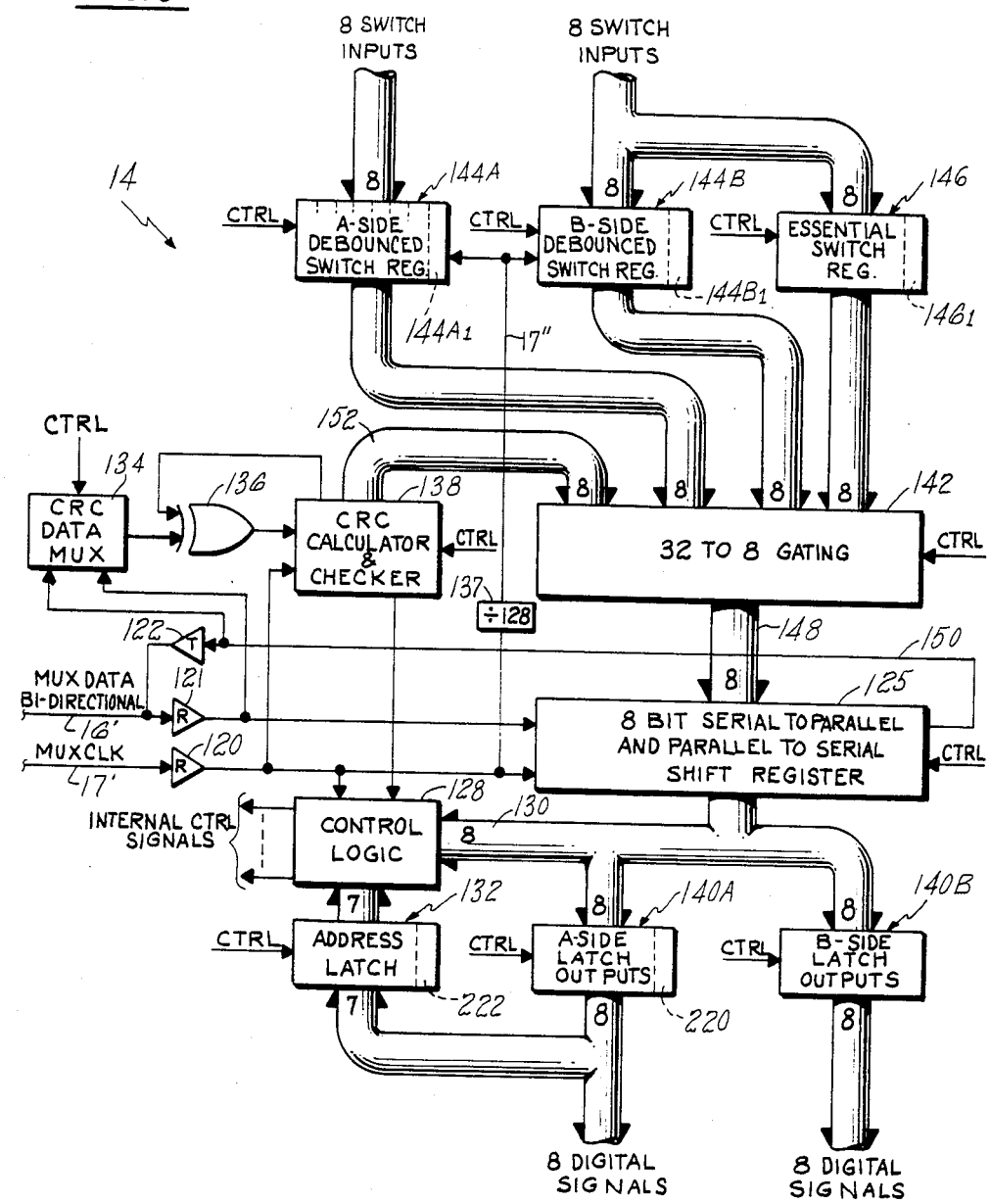
FIG. 6 is a schematic block diagram of a Remote Mux Controller used in the system illustrated in FIG. 1.

A facet of the invention is illustrated in FIGS. 6, 7, and 8 concerning the provision of switch input signals to a Remux 14. It will be noted in FIG. 6 tha MUXCLK received on line 17' is extended, after frequency division of 128 by divider 137 via internal line 17" to the A side debounced switch register 144A and the B side debounced switch register 144B. Each of the registers 144A and 144B includes eight synchronously clocked debouncer circuits adapted for receiving inputs from single-throw switches and providing debounced signals to the remaining circuitry of the Remux for transmission during a response byte. FIG. 7 further illustrates one of the essential switch inputs $146_1$ contained in the essential switch register 146. The individual debouncer circuits for the A and B side registers 144A and 144B are designate $144A_1$ and $144B_1$, respectively. Because the debouncing circuitry $144B_1$ associated with each of the B side switches is identical with that of the A side switch debouncers $144A_1$, only the latter will be described in detail. In those situations employing a single throw switch for input of a control signal to a digital logic system and particularly a logic system which is synchronously clocked, it is often advantageous to "debounce" the resulting signal in order to prevent an inaccurate indication of multiple switch opening and closings upon a single switch actuation. In the illustrated embodiment, many of the input switches 160 are of the single pole, single throw momentary contact type, and the potential problem of switch bounce may be significant. Accordingly, the debounced circuitry $A_1$ is particularly suitable for detecting actuation of a single or multiple pole single throw switch and providing a clean, debounced synchronized signal for use by the internal circuitry of Remux 14 or other similar circuits.

One terminal 161 of single-throw switch 160 is connected to ground (logic 0) and the other terminal 162 is connected through input buffer 163 to an input port of EXCLUSIVE OR 164. A positive voltage of 5 volts is applied to the input terminal 162 via resistor 166 to hold the input side of switch 160 at a logic 1 during its normally-open configuration. It will be appreciated, however, that the debouncer circuitry $144A_1$ is equally suitable with a single-throw switch of normally-closed configuration. The other input to EXCLUSIVE OR gate 164 is provided via line 168 from the Q output of a latch, such as D-flip-flop 170. The output of EXCLUSIVE OR 164 is extended via line 171 to respective inputs on NAND gate 172 and AND gate 174. For synchronization with the remaining internal circuitry of Remux 14, the MUXCLK signal supplied to the Remux on line 17' is processed via control logic 128 to provide an ACLK signal and an ACLK* signal operative in 180° phase relationship during interrogation of the A side inputs, and a BCLK and BCLK* signals operative in 180° relationship during interrogation of the B side inputs. The ACLK signal is applied via line 175 to another input of NAND gate 172. A third input to NAND gate 172 is provided via line 176 from the Q output of latch 178. The other input to AND gate 174 is provided from the Q* output of a latch, such as D-flip-flop 178, via line 179. The output of AND gate 174 is extended via line 180 to the D-input of latch 178. The ACLK* signal is extended via line 181 to the CLK input of latch 178. The output of NAND gate 172 is extended via line 184 to the CLK input of latch 170, the Q* output of that latch being connected via line 185 to its D-input. Finally, an optional preset signal may be applied via line 186 to the Asychonrous Clear (AC) inputs of the latches 170 and 178.

Reference is now made to the operation of a debouncer circuit 144A$_1$, with particular reference to the timing diagram of FIG. 8 which illustrates the signal waveforms at various locations throughout the circuit. The timing waveforms in FIG. 8 are designated according to the numbering in FIG. 7 of the signal line or component on which or at which they appear. The input from switch 160 appearing at terminal 162 is illustrated as normally being high until switch actuation, whereupon it goes low; however, due to bounce there are several alternations between the high and low logic states for an interval designated T$_B$. The input signal 162 is applied to EXCLUSIVE OR gate 164 as is the resulting debounced output signal 168. As long as these signals are equal, i.e., both 1's or both 0's, the output 171 from EXCLUSIVE OR 164 is the logic 0 and no changes occur in the latches 178 and 170. If the two inputs signals to EXCLUSIVE OR gate 164 differ, the output 171 from EXCLUSIVE OR gate 164 is a logic 1. If the signal on line 171 is a logic 1, latches 178 and 170 may change state if the duration of the differing signals at the input of EXCLUSIVE OR gate 164 exceeds a capture time window equal T$_{DB}$ plus T$_A$ for the circuit. The expression T$_{DB}$ of the capture time window represents the interval or period between successive down-steps in the ACLK signal. The expression T$_A$ for the capture time window represents that variable interval between the initial down-step in the switch input signal 162 occurring upon initial switch actuation and the next down-step in the ACLK signal (or up-step in ACLK*). The ACLK signal is a debouncer clock derived as mentioned from the transmitted MUXCLK such that its falling edge, or down-step, is time-synchronous with the system MUXCLK edge at which input data is desired to transition. When the switch input signal 162 does change as a result of actuation of switch 160, it occurs asynchronously with respect to ACLK, the interval of that asynchronism being designated T$_A$ and being equal to or greater than 0 but being equal to or less than the interval T$_{DB}$.

If the signal 171 appearing at the output of the EXCLUSIVE OR gate 164 remains a logic 1 for a second ACLK period following switch actuation, the Q output 168 of latch 170 will toggle due to a clock signal 184 then appearing on its CLK input. This will result in the output 171 of the EXCLUSIVE OR gate 164 then returning to 0 since the Q output 168 of latch 170 is then the same logic state as the switch input signal 162. In any event, the Q output 176 of latch 178 will toggle to a 0 when clocked by the second ACLK* pulse following switch actuation, and in conjunction with AND gate 174, will set up to detect the next change in the switch input signal 162. Typically that next change will be an opening of the switch 160 to return signal 162 to a logic 1; however, the interval until that event will typically be determined by the construction of the switch and the duration of its actuation. For instance, although the trace 162 of switch input illustrates the switch opening after only several ACLK periods, it will be appreciated that it may be longer if the switch is of the momentary type and the user continues to depress the switch. Still further, the switch may remain actuated when the user removes finger pressure, in which case the interval of actuation would continue until the switch is manually opened.

Thus it will be seen that changes of state of the switch input signal 162 that do not exceed the capture time (T$_{DB}$ plus T$_A$), as resulting from bounce, will not result in the output 168 from latch 170 being toggled. Accordingly, a false input signal is not provided as an input to the remaining circuitry of the Remux 14. This is due to the output signal 171 from EXCLUSIVE OR gate 164 returning to the logic 0 state prior to the occurrence of a second ACLK pulse following any particular switch actuation causing a change of state.

It will thus be appreciated that the output 168 of debouncer circuit 144A$_1$ is a clean, debounced input signal which may then be applied to logic such as AND gate 190 such that it may be gated to the remaining relevant portions of the Remux 14 by a gating signal 192 which is provided when an A-side input switch is being interrogated. As mentioned, the debouncing circuitry 144B$_1$ for each of the B side switch inputs is identical to that just described.

In accordance with another facet of the invention to be described hereinafter in greater detail, some of the input switches are associated with so-called "essential" functions. Examples of such essential functions include exterior lighting such as head and tail lights, hazard flashers, keyless entry system, and various others. Because various portions of the Mux system 10 may be placed in a "sleep" mode in accordance with a later described aspect of the invention, it may not be possible to provide clock signals such as ACLK, BCLK, etc., which are required for the proper debounce operation and latching of input signals using only the debouncing circuitry of 144A$_1$, 144B$_1$. Therefore, those input switches identified as being "essential" will also be capable of providing their input via the essential switch register generally designated 146 in FIG. 6, an individual such essential switch register being illustrated in greater detail in FIG. 7 and designated 146$_1$. For convenience, all essential switches in the present system have been associated with the B side input. Thus, it will be seen that the switch input signal 162 extending from a B side input switch in FIG. 7 is extended via line 194 to an essential switch register 146$_1$, and more specifically to one input of a pair of NAND gates 195, 196 which are cross-coupled in a conventional manner to provide a conventional latching circuit. The other input to this latching register 146₁ is a resetting signal, RSTESW* provided via line 197 for resetting the latch following its interrogation. The output signal from the essential switch latch 146₁ appears on lead line 198 where it is held following switch actuation and awaiting interrogation.

Figure 9:
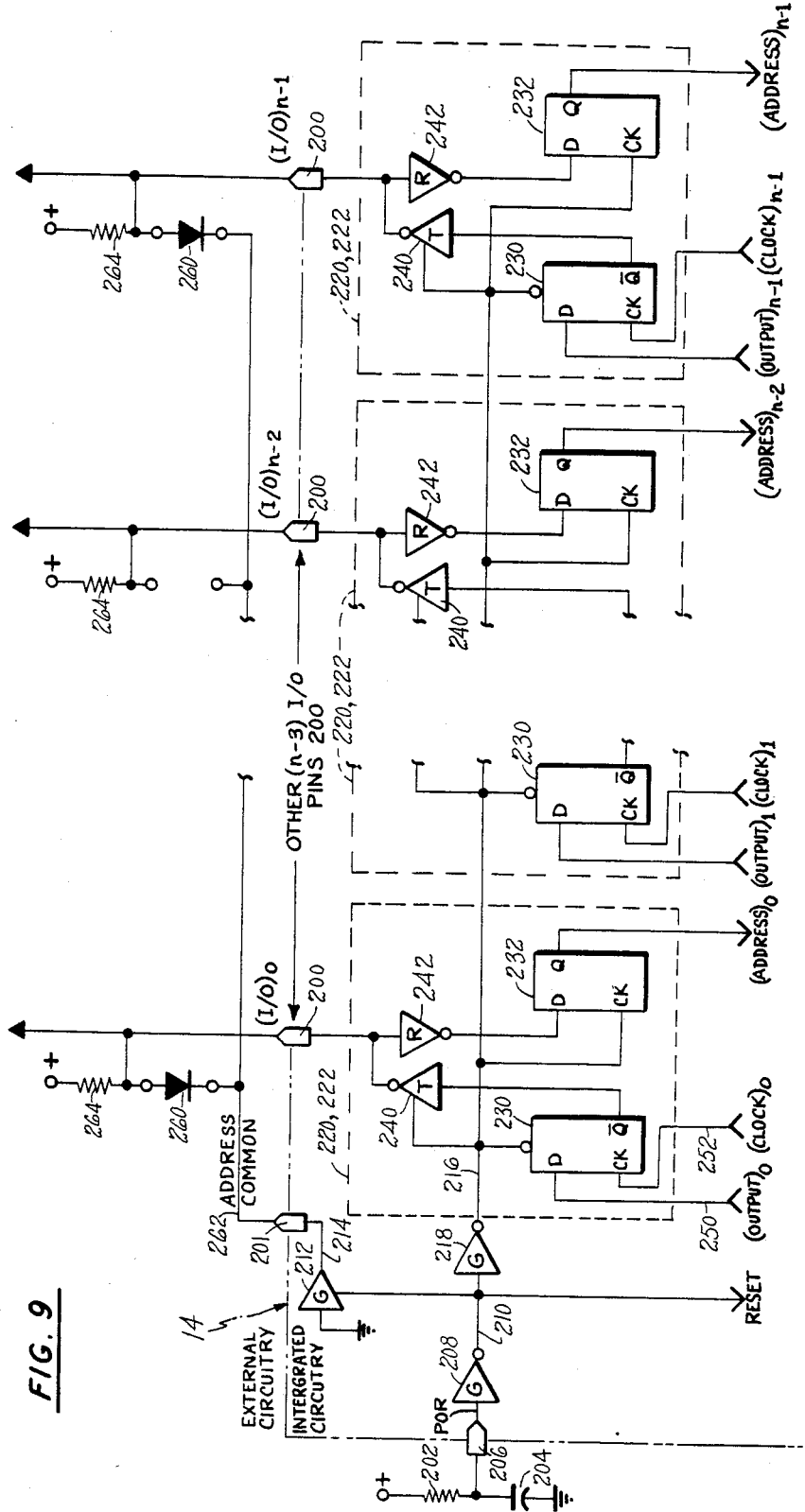
FIG. 9 is a schematic diagram of address input and signal output circuitry used with integrated circuit devices employed in the embodiment of FIG. 7.

A further aspect of the invention resides in the provision of a technique and circuitry for the automatic self-addressing of integrated digital devices. More specifically, the self-addressing circuitry is particularly applicable to large scale integrated circuits where the package pins available for I/O are at a premium. In the embodiment of multiplex system 10 under consideration, such a situation exists in connection with the LSI gate array circuits which make up each of the Remuxes 14. Accordingly, provision is made in accordance with the invention for establishing the address in the address latch 132 of the Remux 14 illustrated in FIG. 6 using the same I/O ports as are used for the output signals from the A side latched outputs 140A. Although in that illustration only seven address entries are made in latch 132 and eight pins are provided for the output of signals from outputs 140A, it will be appreciated that the total number of pins, i.e., eight, are available to the output circuitry and to the address input circuitry. Referring to FIG. 9 there is illustrated in generalized form, circuitry for implementing a time-shared method of digital control output and variable address input on the same actual signal pins of an integrated circuit device, as for instance Remux 14. Assuming some number, N, of I/O pins 200 are provided for time-shared output of data and input of address, it is also necessary to provide one additional I/O pin 201 to serve as an Address Common bus as will be described. Conventional external power-on-reset circuitry comprised of resistor 202 and capacitor 204 generate a power-on reset signal POR which is a normal input signal to Remux 14 provided via a normal existing pin 206 for use, following squaring and inversion by inverter 208 as a reset signal 210 extended to various other portions of the integrated circuitry of Remux 14. Additionally, signal 210 is applied to the enable gate input of a tri-state device 212 having its input connected to ground (logic 0), and having its output connected via line 214 to the Address Common I/O pin 201. The inverted state of reset signal 210 is obtained on line 216 at the output of inverter 218.

The group of A side latched outputs 140A each include eight latches individually designated 220, and the address latch group 132 includes seven address latches individually designated 222. Accordingly in FIG. 9 each D-flip-flop latch 230 for the A side outputs is shown grouped with a respective D-flip-flop address bit latch 232 within a dotted block designated 220, 222. Each function block 220, 222 also includes a respective transceiver comprised of a tri-stated inverting transmitter output circuit 240 and a nontri-stated inverting receiver input circuit 242 of conventional design. The Q* output of output latch 230 is connected as the input to the transmitter circuit 240, the output of which is connected to a respective one of the I/O pins 200 for extension via a respective lead to respective external load circuitry (not shown). Similarly, the input to receiver circuit 242 is connected to the same respective I/O pin 200, its inverted output being connected to the D-input of address latch 232. The RESET* signal appearing on line 216 is connected to the power-on reset, PRST, input of each of the output latches 230 and to the clock, CK, input of each of the address bit latches 232. The RESET* signal on line 216 is also connected to the enabling gate of each tri-state device 240. The D-input of each output latch 230 is supplied with a respective gating signal via a respective lead 250 from the interior logic of Remux 14. A clock signal is supplied to the clock input, CK, of each output latch 230 via respective clocking leads 252 from the interior circuitry of Remux 14.

Finally, a preselected number of diodes 260 are connected with preselected ones of the I/O pins 200, but not necessarily all, in accordance with the particular address to be established and entered in the latches 232 of the integrated circuitry of Remux 14. More specifically, each diode to be used in establishing the address configuration will have its anode connected to a respective one of the I/O pins 200 and will have its cathode connected to a Common line 262 which extends from the Address Common pin out 201 to the cathodes of each of the other diodes 260 to be used in the address configuration. A separate resistor 264 is connected at one end to a respective one of the output pins 200 and at the other end to +5 volts (logic 1) for normally holding the I/O pin 200 at a logic 1 voltage level. Similarly, this logic 1 voltage will be applied to the anodes of those diodes 260 used in the selected address configuration.

Figure 10:
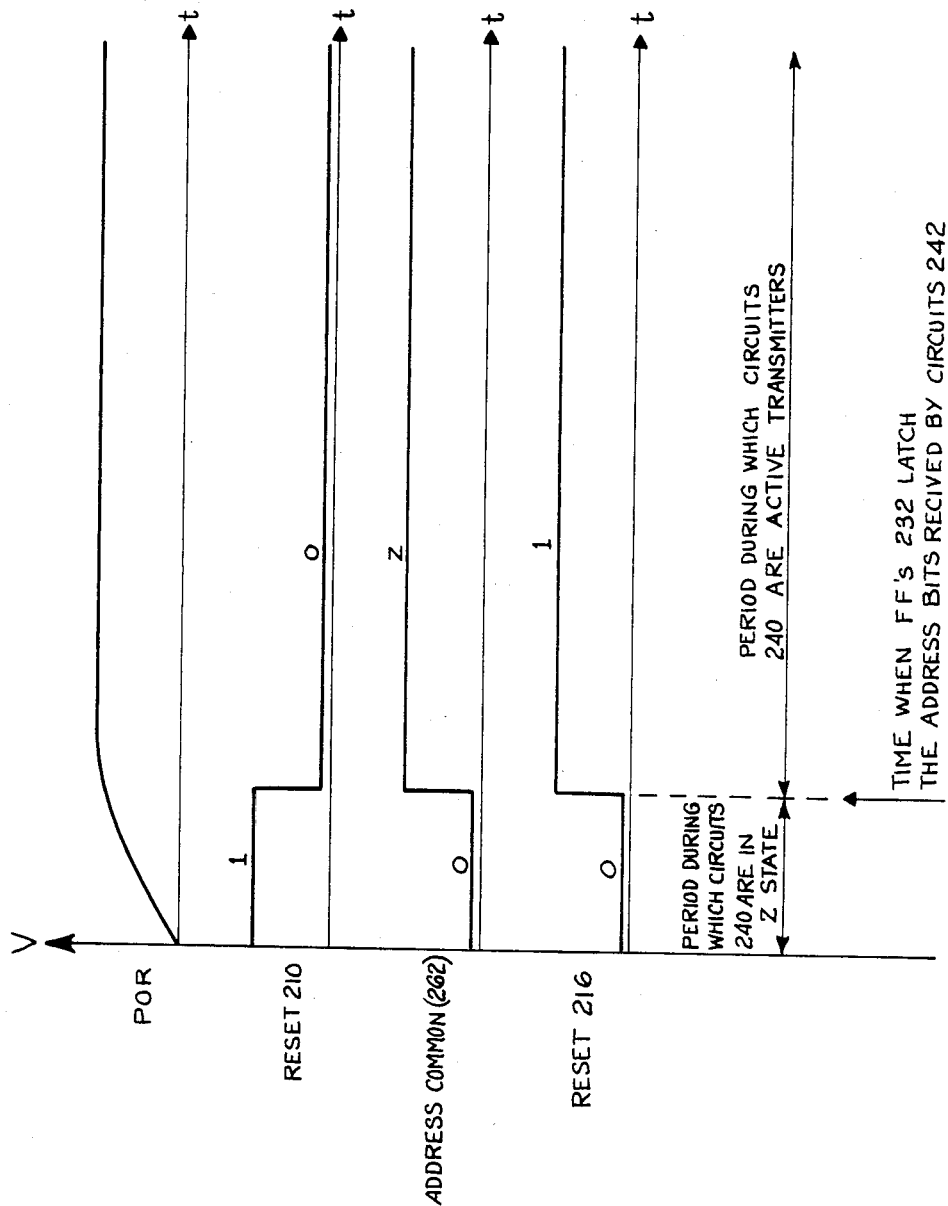
FIG. 10 is a series of waveform illustrations used in the description of the embodiment of FIG. 9.

Having thus described the circuitry for the line 210 time-shared method of digital control output/variable address input on the same I/O pins 200, it is appropriate to discuss the operation of that circuitry with additional reference to the timing diagrams of FIG. 10. When power is first applied, capacitor 204 is charged through a resistor 202 and provides a RESET and RESET* pulse to the circuitry via lines 210 and 216 respectively. Tri-state circuit 212 is of known design and normally provides a high impedance on the address common pin 201 and line 262; however, when the RESET signal on line 210 is a 1, the tri-state device 212 is also active and applies a logic 0 level on the Address Common I/O pin 201 and line 262. This will clamp any of the I/O pins 200 associated with address diodes 260 to the logic 0 level. Indeed, when the diodes 260 are clamped to the logic 0 level, their anodes, the I/O pins 200 and the lower end of resistors 264 will similarly be at a logic 0 level, the resistors typically being about 2.7K ohm and drawing 1.6 ma in this condition.

At the same time that the Address Common line 262 is actively low (0), reset inverter 218 is also low on its output line 216. The signal on line 216 is then effective to place the tri-state devices 240 in the high impedance or Z state, permitting the logic states appearing at the respective ones of the I/O pins 200 to be input through the respective receiver devices 242 and in addition initializes the output latch 230. For those I/O pins 200 to which diodes 260 are not connected, the respective pull-up resistors 264 will maintain the pin at a logic 1 level such that a 1 is applied to the receiver circuit 242. The receiver circuits 242 invert their respective inputs such that the D-input of a respective address latch 232 will receive a logic 1 if a logic 0 appears on the respective input pin 200 and will receive a logic 0 if a logic 1 appears at that pin.

When RESET signal 210 is a 0, the RESET* signal 216 will apply a rising edge to the clock, CK, inputs of each of the address latch 232 and result in these states latching the address bits received via receiver circuits 242. At the same time, tri-state circuit 212 goes to the high impedance Z state and the RESET* signal on line 216 places the tri-stated transmitter devices 240 in the active condition, thereby returning the I/O pins 200 to their normal role as device output pins. The unidirectional characteristic of the signal diodes 260 used in the selected address configuration serves an isolation or steering function which prevents logic states on any of the I/O pins 200 which happen to have addressing diodes 260 installed thereto from affecting each other via the Address Common line 262.

The effect of this time shared use of the pins 200 for data output and for address input is that all Remuxes 14 in multiplex system 10 automatically program their address and do not require any initialization before they can be used. Moreover, from a device design viewpoint a total of N−1 pins are saved for an N-bit addressing requirement. For example, if a 256 address architecture is assumed, eight address bits would be required for each device. This would normally require eight dedicated package pins to implement per device or in the extreme alternative, 256 different device types which are identical except for their address option which is fixed during integrated circuit manufacture. On the other hand, with the above-described circuitry, eight existing output pins would also be used for self-addressing during initial power-up or power-on, and one Address Common pin (201) would have to be added to the package, resulting in a net saving in device pins of N−1=7 pins.

Figure 11:
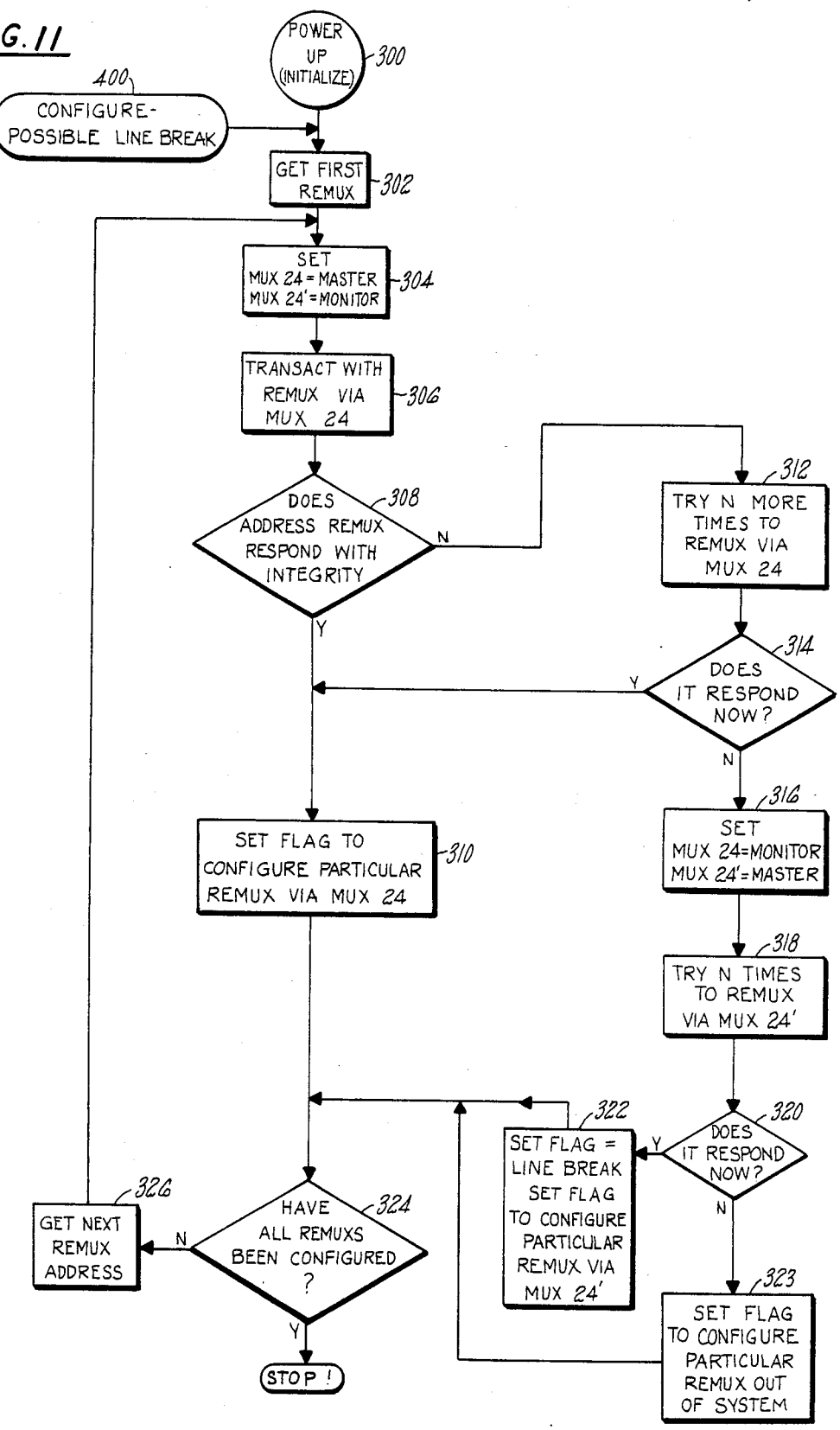
FIG. 11 is a flow diagram of the decision and control routine associataed with configuring the Multiplex Controllers as Master and Monitor for communications integrity for the system.
Figure 12:
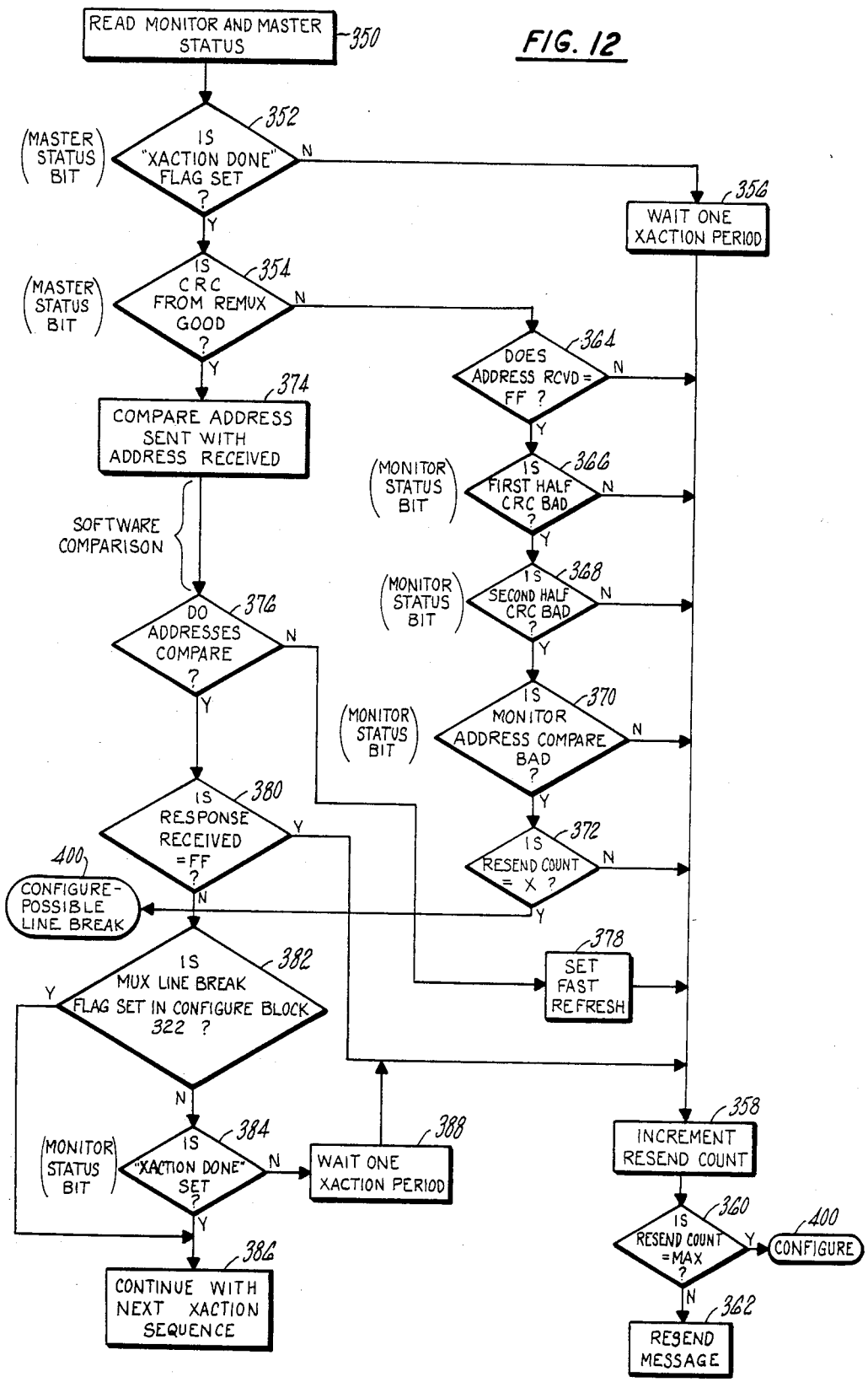
FIG. 12 is a flow diagram of the decision and control routine associated with an evaluation of the integrity of the serial communications.

Having completed a consideration of the circuitry of Remux 14, it is appropriate to further consider the interaction of processor 22, Master Mux 24, Monitor Mux 24′ and, via serial bus 15, the Remuxes 14. Because the system 10 includes a pair of selectable, redundant multiplex controllers 24, 24′ under the direction of a processor 22 in its Mux computer, the system is provided with enhanced integrity and operability. Firstly, the control program of the processor 22 is established such that it configures the Master and Monitor status of the Muxes 24, 24′ to best ensure MUX DATA and MUX CLK transmission to and from the intended Remux 14. To this end one of the redundant Mux controllers is designated a Master and the other is designated a Monitor; however, their relative functions and designations may be reversed in the event the configuring program deems it desirable to effect the communications objective of the system. Stated yet another way, in the event a line break occurs in Mux data line 16 or Mux CLK line 17, somewhere in the external ring or loop bus 15, the Mux computer 12 is capable of recognizing this situation and reconfiguring or reversing the functional roles of the Master and Monitor Muxes 24, 24′. Referring to FIG. 11, the decisional process of processor 22 in configuring the Muxes 24 and 24′ as Master and Monitor or Monitor and Master, respectively, is depicted in flow diagram form. Referring to FIG. 12, the decisional and control process of processor 22 in determining whether or not a transmission using a particular Mux as a Master is "good" or "bad" is depicted in flow diagram form.

Referring first to the flow diagram of FIG. 11, the initial conditions for entering the "configuring" routine include either the power-up initialization step 300 which occurs when power is first applied to the total system or a request for configuration provided as a result of step 400 in the flow diagram of FIG. 12. In either event, step 302 obtains the address of the first Remux to be addressed in a predetermined sequence of Remux addressing. In step 304 the control registers of the Muxes 24, 24′ are set such that a preselected one, i.e., Mux 24, is a Master and the other, i.e., 24′ is the Monitor. Absent a need to reconfigure, i.e., due to multiplex line degradation, this relationship will continue to be maintained. Step 306 then effects transmission of data to and from the addressed Remux via the selected Master Mux 24. Decision block 308 broadly represents one or more tests for determining the integrity and success of the communication transaction. Assuming that integrity is established, a flag 310 is set in the processor's memory which indicates that transmissions addressed to that particular Remux should continue to use multiplexer 24 configured as a Master to effect those transactions. On the other hand, if the integriy determination step 308 results in a negative decision, the effort to accurately complete the transaction to the addressed Remux via the initially selected Master Mux 24 will be repeated some number of times, N, as represented by block 312, and decision block 314 monitors whether or not the repeated attempts are successful. If an attempt is successful (Yes), the program routine returns to the affirmative output of block 308. On the other hand, if after N tries (i.e., eight) the transaction integrity is not established, the control program of the processor will reverse the relative roles of the Master and Monitor multiplexers such that the multiplexer 24 becomes the Monitor and the multiplexer 24′ becomes the Master, as represented by block 316. This reversal of functions is effected by reversing the logic states of the relevant bit sent to the relevant stage of the control registers of the respective Muxes. Then, as represented by block 318, the processor program will try as many as N times to direct communications to and from the Remuxes 14 through the former Monitor, now Master, Mux 24′. Decision block 320 determines whether or not this effort through the reconfigured arrangement of the Muxes is successful and assuming it is, the conclusion of block 322 is that a line break or the like has prevented the Mux computer from addressing the particular Remux through original Master 24 and must now address that Remux using Mux 24′ as the new Master. Block 322 will set flags in memory so as to indicate a line break and to thereafter direct communications with that particular Remux through Mux 24′ configured as a Master. If however, the decision of block 320 was negative, that particular Remux will thereafter be configured out of the system of possible Remux addresses, as represented by block 323.

Returning to the main trunk of the flow diagram, and specifically to the output of block 310 and the input of block 324, an effective path through either of the Muxes 24 or 24′ to the Remuxes addressed up to that point will have been established or else a particular address will have been configured out of the system. Block 324 asks whether all valid Remux addresses have been configured and if not, an instruction is issued by block 326 to get the next Remux address and the routine then returns to the entry point to block 304. When all Remuxes have been configured, the configuring routine is stopped.

Referring to the flow diagram of FIG. 12, there is illustrated the decisional routine associated with "good" and "bad" communication transactions between the Mux computer 12 and the various Remuxes 14. At the entry 350 to this routine, a transaction between the Master Mux and a Remux has occurred, and the Address and Command sent by the Master and the Address and Response received by the Master from a Remux are in memory 25. Step 350 provides for reading the Status Registers in both the Master and the Monitor Muxes 24, 24'. Based on that information, numerous decisions can then be made.

First, a check is made at block 352 to see if the "transaction done" flag for the Master has been set. If the transaction does not appear to be done, the routine branches to an arm having block 356 which requires that the decision logic "wait one transaction period", a block 358 which increments a "resend" count, a block 360 for determining if the "resend" count is yet a maximum, and a block 362 for resending the message or transaction if the "resend" count is not a maximum. If the "resend" count is a maximum, the routine jumps to the "configure" entry point 400 into the configure routine illustrated in FIG. 11.

Assuming at block 352 that the transaction had been completed as is normally the case, block 354 determines if the CRC at the Master from the Remux is valid. If that CRC is not good, as by failure of CRC's to compare, the routine branches to a decision chain which first determines at block 364 if the Address received by the Master and conveyed to processor 22 is hexadecimal FF, i.e., all 1's. Such a condition is an invalid address and usually exists only if the MUX DATA line 16 is open and thus pulled to a constant logic 1 level. If the Address is not FF, the "resend" count is incremented at 358 and the message is resent at 362 unless the resend count is a maximum. If the Address is FF, a Monitor status bit is checked at 366 to determine if the first half (i.e., Master transmit) CRC is bad. If it is not bad, the "message resend" routine 358–362 and 400 is pursued; otherwise a Monitor status bit is checked at block 368 to determine whether the second half (i.e., Remux reply) CRC is bad. If it is not, the "message resend" routine 358–362 and 400 is pursued; otherwise a Monitor status bit is checked at block 370 to determine if the addresses sent by the Master and by the Remux fail to compare. If those addresses do compare, the "message resend" routine 358–362 and 400 is pursued; otherwise a check is made at block 372 to determine whether the "resend" count is some value X If this "resend" count is X, the routine jumps to the entry point 400 of the configure routine of FIG. 11.

Returning to block 354 in the main trunk of the "good-bad" transaction routine, if the CRC from the Remux at the Master is good, a comparison is made of the Address sent by the Master and the Address received by the Master from a Remux. This comparison is made in the software associated with processor 22, and is represented by blocks 374 and 376. If the Addresses do not compare, the "message resend" routine of 358–362 and 400 is pursued; however, an optional "fast refresh" may first be provided. The "fast refresh" serves to accelerate a "refresh routine" (not shown) for reinstating the Remux outputs. Assuming the Addresses do compare, the Response received at the Master and conveyed to processor 22 is inspected at block 380 to determine if it is a hexadecimal FF. If it is FF, the "message resend" routine of 358–362 and 400 is pursued; otherwise the routine proceeds to decision block 382 to check whether the "line break" flag has been set in block 322 of the "configure" routine. If the "line break" flag has not been set, the routine moves to block 384 to see if the Monitor's "transaction done" status bit has been set. If it has been set, the next transaction sequence may proceed, as represented by block 386. It will be understood that the check for the Monitor's "transaction done" status might have occurred earlier in the decision chain. Similarly, if the "line break" flag of 322 has been set, thus indicating that the Master and Monitor have been configured to compensate for that situation, the next transaction sequence may proceed. If the Monitor's "transaction done" flag is not set, the routine branches through a "1 transaction period wait" at block 388 and then to the "message resend" routine of 358–362 and 400.

The aforedescribed "good-bad transaction" routine serves to incorporate a number of integrity checks and provides for several attempts at resending a transaction before postulating that a line break exists and that reconfiguration of the Master and Monitor Muxes may be required.

Reference is now made to an aspect of the invention illustrated in greatest detail in FIGS. 1, 2, 3A and 3B in which provision is made for operating the multiplex system 10, and particularly a portion thereof represented by the dotted block 500 in FIG. 2, in a lower power mode for various intervals. Due to the limited capacity of the system's power source which typically is an automobile 12 volt storage battery, provision is made for extending the life of the power source by minimizing the power consumed by the multiplex system 10 as a whole, and particularly that portion of the multiplex computer 12 designated 500 in FIG. 2 which includes the microprocessor 22, the system clock source 28, the ROM 27 and the decode control 34, and thus being all of the circuitry in FIG. 3A.

Prior to considering a functional description of the low power operation of the Mux system 10 via a so-called "sleep" mode, that circuitry external to the microprocessor 22 which is utilized in this process will be discussed. Referring specifically to FIG. 3B, all of the circuitry depicted therein is constantly connected to a +5 volt supply voltage derived from an automobile storage battery or the like. This circuitry is utilized in the control of the microprocessor 22 and in providing various timing functions utilized to implement the low power "sleep" mode and to thereafter "reawaken" the system.

The 50 KHz oscillator 30 is of conventional RC design and provides a 50 KHz signal to the clock input CK1 of an eight stage counter 32. The stages of the counter are connected so as to provide at its first $Q_A$ output the 25 KHz square wave signal which is extended to the Master and Monitor Muxes 24, 24' as the MUXCLK. The final $Q_D$ output of counter 32 is connected to the CK1 clock input of counter 33 to continue the ripple-down count provided by counter 32. It will be important to note, however, that the CL2 reset input for the second half of counter 32 and the CL1 reset input to the first half of counter 33 serve to reset those portions of the counters 32 and 33 and thereby change their count cycles when reset pulses are provided. Reset pulses are under control of processor 22 and usually follow NMI* pulses.

The $Q_A$ output of the first stage of counter 33 is extended via line 510 to one input of an AND gate 512, the output of which is extended via line 514 to the CL2 reset input to the second half of counter 33. The $Q_C$ output of the third stage of counter 33 is extended via line 515 to one of the inputs of NAND gate 516, the output of which is extended to the D-input of D-flop-flop 518. The $Q_D$ output of the fourth stage of counter 33 is extended via line 519 to one input of AND gate 520 and to the CK2 clock input of the second half of that counter. The $Q_D$ output of the eighth stage of counter 33 is extended via line 522 to the input of an inverter 523 and also provides the reset signal, RESET. That RESET signal is extended through inverter 524 in FIG. 3A to provide the RESET* input to microprocessor 22 and to also provide signal $PUR_2$ applied to the MR* inputs of Master and Monitor Muxes 24, 24'.

The signal appearing on line 522 comprises one of the inputs to power control circuitry generally included within dotted enclosure 35. Power control circuitry 35 initiates and terminates the lower power or "sleep" mode of operation. In addition to inverter 523, the power control logic 35 includes a D-type flip-flop latch 526, an AND gate 528 and finally a gated power switch such as MOSFET 530.

The AND gate 516, D-flip-flop 518, D-flip-flop 532, and NAND gate 534 provide logic which, in conjunction with the counters 32 and 33, provides interrupt signals at 20 ms intervals as will be hereinafter discusssed, and genrally corresponds to pulse generator 36 in FIG. 2. Further, circuitry comprised of D-flip-flops 536, 538 and 540, as well as AND gate 542, serve to reset counters 32, 33.

Under normal operation, the D-flip-flop 518 will provide a nonmaskable interrupt signal, NMI* for controlling operation of the program for processor 22. The NMI: signal is first provided 20 ms after the system is first powered and a power-up reset pulse PUR1 has occurred. Thereafter, NMI* interrupt signals will be generated at 20 ms intervals during normal powered operation of the microprocessor 22. The NMI* signal is that transition occuring at the Q* output of flip-flop 518 when the first memory request signal MREQ* is applied to the clock CK input of the flip-flop following its D-input going to a logic 1 at 20 ms intervals. That enabling of the D-input of flip-flop 518 at 20 ms intervals is determined by line 515 from counter 33 and is conditioned upon the system being in its "on" or "awake" mode, as represented by the signal appearing on line 550 applied to the other input of AND gate 516. The MREQ* signal is also extended to the CK input of D-flip-flop 532 which has its D-input connected to the Q output of flip-flop 518. The Q* output of flip-flop 532 is provided as one input to NAND gate 534, the other input to which is provided by the Q output of flip-flop 518. Accordingly, a resetting signal coinciding with the NMI* pulse is provided on line 552 at the output of NAND gate 534 at 20 ms intervals and continues until the next MREQ* signal. The reset signal appearing on line 552 is extended to the CL* input of D-flip-flop 536 which reenables the timer reset logic 538, 540 and 542.

Flip-flops 538 and 540 are initially cleared by a power-up reset PUR1 upon initial application of power. Further, the Q* output of flip-flop 536 is set to a logic 1 by the signal appearing on line 552 following each NMI* signal. This action sets flip-flops 538 and 540 such that their Q* outputs connected to the input of NAND gate 542 are both set to 0 and 1 respectively when a 50 KHz clock is applied to their respective clock CK inputs. Accordingly, the output of AND gate 542 would then be 0 and would not effect a resetting of timers 32 and 33. However, if the microprocessor 22 is operating normally, after responding to a NMI* pulse it will generate a timer reset signal, TIMERST which is extended to the clock CK input of flip-flop 536 for togging first that flip-flop and then the two subsequent flip-flops 538 and 540 such that the output of AND gate 542 goes to a logic 1. Such a logic 1 at the output of AND gate 542 then effects a resetting of the last four stages of counter 32 and the first four stages of counter 33. Under normal operation, the TIMERST resetting signal is provided at approximately 20 ms intervals and accordingly, the counter 33 is reset before it proceeds to the next count following its 20 ms output from the third stage on line 515.

In the event the microprocessor 22 is operating incorrectly, is unpowered or becomes "lost" and fails to generate the TIMERST signal to the counter resetting circuitry, the counters 32 and 33 will no longer be reset and will continue their normal ripple-down count. Under such circumstances the counter 33 will continue to count beyond the 20 ms interval at which it would normally be reset and will reach a time of 40 ms which is reflected by a logic 1 appearing on line 519 applied to the input of NAND gate 520. If at that time the other input to NAND gate 520 is a logic 1, as will be the case during normal powered operation, the NAND gate will output a logic 1 signal which is extended via line 556 to the PR* input of latch 526 such that its Q output is set to a logic 1. Significantly, the power MOSFET 530 is "on" and provides $+5 V_{SW}$ when its gate input is a logic 0, and is off when its gate input is a logic 1. The Q output of flip-flop 526 is extended via line 558 to the control gate of FET 530 such that when it goes to a logic 1, the FET is switched off and $+5 V_{SW}$ is disconnected from the circuitry 500. When that $+5 V_{SW}$ supply is disconnected from the microprocessor 22, the system enters a "power-down" or "sleep" mode.

Because the counter 33 is continuing to count down beyond the 40 ms time at which it placed the microprocessor in the power-down or "sleep" mode, it may then provide a reenabling or "wake-up" signal at some later time. Specifically, when the interval since the last NMI* interrupt reaches about 654 ms, the final stage of the timer 33 will go to a logic 1 which is extended via line 522 to provide the aforementioned reset pulse RESET and to provide a wake-up signal to the input of inverter 523 in the power control circuit 35. Inverter 523 will then provide a 0 at the CL* reset input to latch 526, thereby resetting its Q output to a logic 0 which turns FET switch 530 "on" and reapplies power to the microprocessor 22 and other circuitry 500. In this manner the logic repeatedly tries to get the microprocessor 22 back into an operational mode after a "watchdog" event by first powering down and then repowering and, at the time of repowering, by extending a reset signal RESET to the processor to initialize it at each attempted restart. When and if the processor 22 is effectively restarted, it will resume generating TIMERST pulses to effect resetting of timer counters 32, 33 for inhibiting subsequent "watchdog power-down".

When the Q* output of power control latch 526 goes to a logic 1 at the time of "wake-up", that 1 is extended via line 550 to an input of AND gate 512. Following a short delay, i.e, 5 ms, the first stage of counter 33 will send a pulse via line 510 to the other input of AND gate 512, resulting in a reset pulse being extended via line 514 to reset the second half of counter 33.

The power control switch 35 has been discussed in association with the initiation of power-down in response to the watchdog circuitry timing out because no TIMERST resetting pulse occurred. However, that power switch 35 may also be used to power-down the microprocessor 22 and place it in a "sleep" mode in response to a control signal provided by the processor. Specifically, if it is desired to enter a "sleep" mode the processor 22 may generate a "power-down" or "power- "off" strobe signal, PWRSTB, derived via the timer decode logic 34C. The PWRSTB signal is extended to the clock CK input of the power control latch 526. Because the D-input to latch 526 is held at a logic 1, the application of the PWRSTB signal will result in the Q output of that register being set to a logic 1, thereby turning off the power FET 530. In this way the processor 22 can place itself and the other circuitry within block 500 in the "sleep" mode such that all communications on the Mux Data line 16 are stopped and the MUXCLK signal on line 17 is turned off.

The timing of the PWRSTB signal which initiates the "sleep" mode is pre-established to occur shortly after the issuance of a TIMERST pulse such that little or no time has elapsed since the timers 32 and 33 were reset. Accordingly, those timers 32, 33 will begin their timing at substantially the same time as the "sleep" mode is initiated by PWRSTB. When 654 ms have elapsed and the line 522 from timer 33 goes to a logic 1, the power control register 526 will reverse states and the FET power switch 530 will again be turned on to "wake-up" or "power-up" the processor 22 and the other circuitry within block 500.

The power control switch 35 additionally provides, via the output of AND gate 528 and the inverter 566, a Chip Select signal CS* which is extended to the CS* inputs of Master and Monitor Muxes 24, 24'. When the CS* signal is in its active low state while power is being supplied to the microprocessor, it enables the Mux devices to accept control signals from processor 22. On the other hand, when the CS* signal goes high during a "power-down" interval or mode, the Muxes 24, 24' are prevented from accepting any signals from processor 22 and will place the MUXCLK signal on line 17 at a constant high level for its duration.

Further, the power switch circuitry 35, via the output from AND gate 528 and the NAND gate 568, will serve to inhibit the enabling of RAM 26 by RAM enable signals RAMENB applied to the other input of the NAND gate 568 so long as the system is in the "power-down" or "sleep mode". This provision is desirable inasmuch as the RAM 26 is not to be enabled during the "power-down" mode and there is a chance that the RAM decode circuitry 34B might inadvertently provide an enabling signal RAMENB at or during the "power-down" mode.

The operation of the Mux computer 22 and Remuxes 14 will now be considered in accordance with the functional flow diagram of FIG. 13 which illustrates placement of the system in the low power of "sleep" mode and the subsequent return to a "power-up" status. This routine is controlled principally by the programming of the processor 22, which program may be readily implemented by one skilled in the art in view of the description and flow diagrams. One portion of the routine does rely upon the hardware of timer 16 and the power control switch 35, as has been and will be explained.

The various "essential" body electrical functions previously mentioned are those which must function independently of the vehicles' ignition switch position. For example, lights (exterior, headlamps, hazard, etc.) must be operable at all times and are thus an "essential" function. On the other hand, windshield wipers only operate when the ignition switch is "on" in the "RUN" or "ACCESSORY" position and are thus a "nonessential" function. The multiplex system 10 is powered directly from the vehicles' battery rather than through the ignition switch because of these essential functions.

However, the "sleep" mode provided herein serves to automatically reduce the power drain on the battery by the multiplex system during periods of inactivity, such as when the vehicle is parked. The "sleep" mode and the "essential" switch inputs 146 have been configured such that the multiplex system resonds to essential inputs within a reasonable time even though the system may have been in a "sleep" mode.

Referring to FIG. 13, the programmed processor 22 periodically looks at the ignition switch, as represented by flow diagram block 600. The ignition switch (or switches, if more than single "on" and "off") is connected to a B-side debounced input $144B_1$ of a Remux 14, and thus also is connected to an essential switch register $146_1$. Decision block 602 determines whether or not the ignition system is "off" and if it is not, the routine goes immediately to block 630 which tells the system to remain "on" or "powered-up" and to service the operator's commands. If the ignition system is "off", the routine moves to step 604 which begins the "sleep" decision process.

The first determination of the "sleep" decision process, as represented by block 606, is whether the exterior light system or hazard light system (or other "essential" function), is "on". If one is "on", the routine goes to block 634 to remain "on", but if none are "on", a 10 second monitoring time period is provided during which the power is maintained, as represented by block 608. The 10 second monitoring period is measured by the program software. During the 10 second monitoring period the system inputs continue to be scanned, as seen in block 610, and decision block 612 determines whether or not any "essential" function or ignition switch has been activated during the 10 second monitoring interval. If so, the system continues to poll switches and service driver's commands, as represented at block 630, and the loop returns to block 600. If a switch has not been activated during the 10 seconds, the decision is made to enter the "sleep" mode of step 616.

The "sleep" mode sequence first provides, at block 618, for all of the Remuxes 14 to be placed in their lower power dissipation mode by setting their output latches 140A and 140B so as to deactivate the loads and by gating "off" the MUXCLK. Deactivating the loads puts the external electronic drives in the lowest power configuration. Gating "off" the MUXCLK puts the Muxes and Remuxes in the lowest power configuration due to the fact that CMOS power consumption is directly related to the number of gate transitions in the device. Next, as represented by block 620, a power-off strobe pulse PWRSTB is generated by the software for extension to the power switch latch 526. Block 622 indicates that the PWRSTB pulse and latch 526 operate to switch "off" the $+5$ $V_{SW}$ power for the Mux computer circuitry in dotted box 500 in FIG. 2. The power for the circuitry in box 500 is timed to remain "off" for 654 ms, with the dotted line path to block 624 representing that this timing is a hardware function and that power is switched back on at the end of the timing interval.

When power is restored to the full system at the end of the 654 ms timing interval as represented by block 626, the MUXCLK is restored to the Remux devices and their "essential" switch registers 146 are interrogated. Next, at decision block 628, the routine determines whether or not any "essential" switch activity occurred during the immediately preceding 654 ms "sleep" interval. If such activity did not occur, the routine returns to block 620 to reenter the "sleep"

mode. If, however, "essential" switch activity did occur, the routine proceeds to block 630 where it continues to poll switches and service driver commands. The routine then restarts the "low-power" decision at block 600. It may be noted that no response action is taken based only on an input from an "essential" register 146₁. Instead, the system seeks further confirmation from the corresponding B-side debounced switch while next "powered up". The power required by the multiplex system 10 during the "sleep" mode is less than 10% of that required during power-up, and the average power consumption will be a function of the duration of the respective "sleep" intervals. Longer "sleep" intervals will decrease power consumption, but must not be so long as to unreasonably delay response to an input from an essential switch. "Sleep" intervals in the range of 250–750 ms are realistic, and a steady-state drain of less than 10 milliamperes on the vehicles' 12 volt battery has been attained during the "sleep" mode.

Although this invention has been shown and described with respect to detailed embodiments thereof, it will be understood by those skilled in the art that various changes in form and detail thereof may be made without departing from the spirit and scope of the claimed invention.

I claim:

1. An improved debouncer circuit for providing debounced, synchronously-clocked digital signals from a single-throw switch comprising:
   means for providing an input signal voltage which changes logic levels as a result of actuation of a single-throw input switch which is operable between open and closed states, said input signal being subject to switch bounce;
   EXCLUSIVE OR gate means having two inputs, one said input having said input signal connected thereto;
   an output data latch having a data input, a clock input, and complementary Q and Q* output terminals, a logic data level appearing at said data input being latched on said Q output terminal when said clock input receives a clocking signal, either of said Q or $\overline{Q}$ complementary output terminals providing the debounced, synchronously clocked digital signal resulting from said input signal voltage, a signal representing said Q* output terminal being connected to the data input of said output data latch for toggling both of said complementary output terminals upon receipt of a clocking signal at the latch clock input;
   means for coupling said signal from said output data latch Q output terminal to said other input of said EXCLUSIVE OR gate means such that the output of said EXCLUSIVE OR gate means is a logic ONE level only when said two inputs thereto differ;
   means for providing a synchronous clock signal having a period $T_{DB}$; and
   logic means coupled to the output of said EXCLUSIVE OR gate means and to said synchronous clock signal for providing a latch clocking signal as an output thereto in synchronism with said synchronous clock signal, said latch clocking signal being coupled to the clock input of said output data latch and thereby toggling the signal on said debounced output terminal only if said input signal voltage changes state and remains in the new state for at least a capture time interval of $T_{DB}+T_A$, where $T_A$ represents the variable internal between the initial change of state of said input signal and the next occurring synchronous clock signal.

2. The improved debounce circuit of claim 1 wherein said synchronous clock signal comprises a pair of complementary clock signals in 180° phase relationship; and
   said logic means comprises a NAND gate, an AND gate and a second data latch also having a data input, a clock input and complementary Q and Q* output terminals, the signal at the output of said EXCLUSIVE OR gate, one phase of said synchronous clock signal and the Q output terminal of said second data latch each being applied as respective inputs to said NAND gate, the output of said NAND gate being said latch clocking signal, the signal at the output of said EXCLUSIVE OR gate and the $\overline{Q}$ output of said second data latch each being applied as respective inputs to said AND gate, the output of said AND gate being coupled to the data input of said second data latch, and the other phase of said synchronous clock signal being applied to the clock input of said second data latch whereby said capture time interval is established.

3. The improved debouncer circuit of claim 2 wherein both said output data latch and said second data latch are presettable in response to a preset signal and further including means for providing a preset signal operatively connected to said output data latch and said second data latch for presetting their respective output terminals prior to the introduction of any input signals.

* * * * *